(12) United States Patent
Kraz

(10) Patent No.: US 7,795,875 B2
(45) Date of Patent: Sep. 14, 2010

(54) ELECTROSTATIC DISCHARGE EVENT AND TRANSIENT SIGNAL DETECTION AND MEASUREMENT DEVICE AND METHOD

(75) Inventor: Vladimir Kraz, Santa Cruz, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/403,514

(22) Filed: Mar. 13, 2009

(65) Prior Publication Data

US 2009/0167313 A1 Jul. 2, 2009

Related U.S. Application Data

(62) Division of application No. 11/220,934, filed on Sep. 6, 2005, now Pat. No. 7,525,316.

(51) Int. Cl.
*G01R 29/12* (2006.01)
*G01R 31/02* (2006.01)

(52) U.S. Cl. .................... 324/457; 324/72
(58) Field of Classification Search ............... 324/457, 324/458
See application file for complete search history.

(56) References Cited

U.S. PATENT DOCUMENTS

| 4,631,473 | A |   | 12/1986 | Honda |         |
|-----------|---|---|---------|-------|---------|
| 5,315,255 | A |   | 5/1994  | Bettinger | |
| 5,422,630 | A | * | 6/1995  | Quinn et al. | 324/713 |
| 5,719,502 | A |   | 2/1998  | Verbiest et al. | |
| 5,903,220 | A |   | 5/1999  | Jon et al. | |
| 5,923,160 | A | * | 7/1999  | DeChiaro et al. | 324/457 |
| 6,144,341 | A |   | 11/2000 | Kraz | |
| 6,563,319 | B1 |  | 5/2003  | Kraz | |

* cited by examiner

*Primary Examiner*—Timothy J Dole
(74) *Attorney, Agent, or Firm*—Johannes P. M. Kuster

(57) ABSTRACT

An electrostatic discharge (ESD) event and transient signal detection and measurement device and method are described. The device and method are able to distinguish between an ESD event and other non-ESD events.

5 Claims, 20 Drawing Sheets

ELECTROSTATIC DISCHARGE EVENT AND TRANSIENT SIGNAL DETECTION AND MEASUREMENT DEVICE AND METHOD

CROSS REFERENCE TO RELATED APPLICATIONS

This application is a divisional of U.S. application Ser. No. 11/220,934, filed Sep. 6, 2005, issued as U.S. Pat. No. 7,525,316, the disclosure of which is incorporated by reference in its entirety herein.

FIELD OF THE INVENTION

The invention relates generally to a system and method for detecting and measuring an electromagnetic signal and in particular to a system and method for detecting and measuring electrostatic discharge (ESD) events.

BACKGROUND

It is well known that electrostatic discharges (ESD) can damage electronic devices. Examples of such sensitive devices are semiconductor wafers, magnetic heads for disk drives, integrated circuits, other electronic components and circuits, etc. The ESD can disrupt operation of an electronic circuit as well. In non-electronic applications such as powder handling, etc., ESD can be a cause of fire.

Short transient spike-like signals resulting from ESD events, commutation of electric motors, solenoids, etc. and from other sources can also induce damage to electronics devices and cause circuit malfunction. Also, improperly done ground wires can be a media for transmitting surges as well.

Presently, the most common method of reducing damages caused by ESD is preventive: grounding wrist-wraps, conductive chairs, conductive floor coating, ionizers, etc. All these measures are supposed to reduce or eliminate build-up of static voltage that causes discharges. However, the ultimate indication of the effectiveness of ESD-preventive measures is actual occurrence of electrostatic discharge (ESD) events known as ESD Events. The detection, measurement of magnitude of the ESD Events and data logging the data for future analysis presents valuable information for assessment of the ESD environment, ESD protection, real-time addressing of the ESD problems, determining most likely defects due to ESD, and statistical process analysis.

The ESD Event detection devices available today, such as that shown in U.S. Pat. No. 4,631,473 to Sanki and Lucent' T100 provide an indication of ESD events that exceeded a preset level. However these devices merely detect that ESD Events have occurred without the ability to measure the magnitude of the ESD Events. The knowledge of the magnitude of ESD events provides valuable information pertinent to assessment of potential damage caused by ESD and also effectiveness of ESD-preventive measures. In addition, existing devices are geared towards occasional ESD checks, rather than day-to-day ESD monitoring. The continuous ESD monitoring would offer a real-time indication of ESD problems and provide immediate feedback for implementation of ESD-corrective and preventive measures.

ESD events last for a very short period of time (typically, nanoseconds). This makes it very difficult to provide a measurement of the magnitude of these ESD events in a practical cost-effective and user-friendly manner. Often, a high-speed oscilloscope and an antenna are used to capture the waveform of an ESD Event for analysis of its magnitude. This technique is not practical for everyday use. Thus, it is desirable to provide a device that is able to detect ESD events, the magnitude of the ESD events and distinguish actual ESD events from other transient signals. Thus, it is desirable to provide an ESD event and transient signal detection and measurement device and method and it is to this end that the present invention is directed.

SUMMARY

A method and the implementation of improved accuracy of measurement of ESD events are described. The system and method permits an actual ESD Event signal to be distinguished from other non-ESD Event signals. The system may use filtering and/or pattern recognition to detect the ESD Event signals. In an embodiment, the system may be a low bandwidth active electronic circuit that responds in a particular manner to a signal having characteristics similar to an ESD event signal and responds in a different manner to other signals. In a preferred embodiment, the low bandwidth active electronic circuit may be an operational amplifier or a follower circuit. The pattern recognition may be implemented in software or hardware.

Thus, in accordance with the invention, a device for detection of electromagnetic emission events is described. The device has a receiver that receives an electromagnetic emission and a low-bandwidth active electronic circuit with a bandwidth lower than a bandwidth of the received electromagnetic emission. The low-bandwidth active electronic circuit generates a slowly decaying output signal in response to the received electromagnetic emission having a predetermined rise time so that an electromagnetic emission event with a predetermined rise time is identified.

In accordance with another aspect of the invention, a device for identifying an ESD event is provided. The device has a receiver that receives an input signal and an identifier unit that compares the received input signal to a predetermined signal in order to determine if the input signal is an ESD event signal. The device may also have an output circuit for outputting an identification signal if the input signal is identified as an ESD event signal.

In accordance with another aspect of the invention. a device for identifying an ESD event is provided that includes a receiver that receives an input signal, the input signal having an envelope and an identifier unit that compares the received input signal envelope to a predetermined signal envelope in order to determine if the input signal is an ESD event signal. The device may also have an output circuit for outputting an identification signal if the input signal is identified as an ESD event signal.

In accordance with another aspect of the invention, a device for measuring an emission signal from a distance is provided. The device has a receiver that receives an input signal and a signal distance measuring unit that determines a distance to the input signal. The device also has a signal strength determining unit that determines a strength of the input signal based on the input signal and the distance to the input signal. The distance may also be entered into the device manually.

In a different aspect, an electrostatic discharge event emission detection device is provided. The device is a receiver that receives an input signal and a signal distance measuring unit that determines a distance to the input signal. The device also has a signal strength determining unit that determines a strength of the input signal and a processor that determines a voltage that caused the input signal, the voltage being determined based on the distance to the input signal, the strength of the input signal and a model of discharge of the input signal.

DETAILED DESCRIPTION

Figure 1:
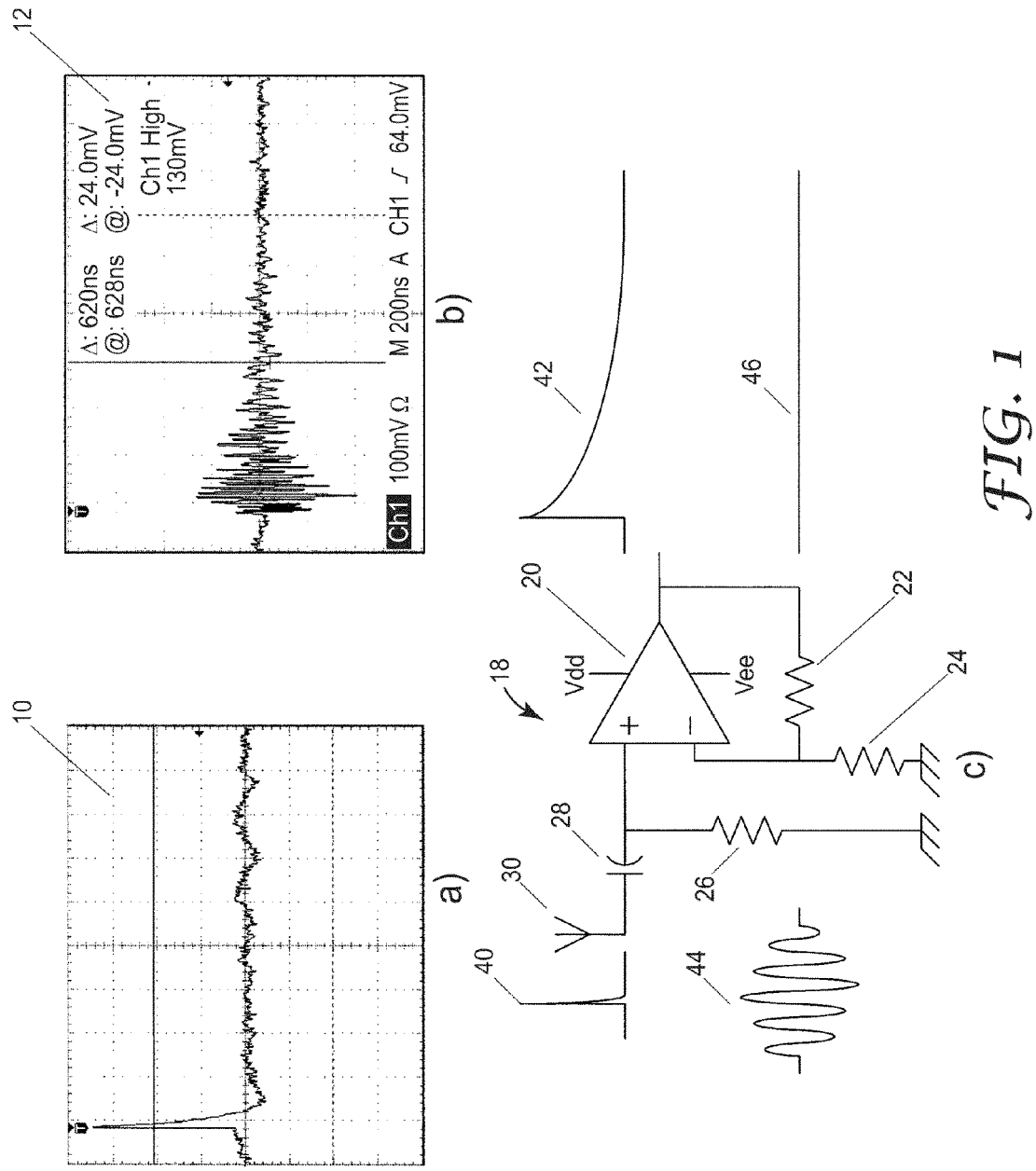
FIG. 1a illustrates a typical waveform of an electrostatic discharge event.
FIG. 1b illustrates a typical waveform of other transient signals.
FIG. 1c is a diagram illustrating an amplifier made with an operation amplifier.

The invention is particularly applicable to a device and method for ESD event measurement and it is in this context that the invention will be described. It will be appreciated, however, that the device and method in accordance with the invention has greater utility since the device could also detect and measure other electromagnetic signals and transient events.

FIG. 1a illustrates a typical waveform 10 of an electrostatic discharge event. In general, electrostatic discharge (ESD) event detection and measurement may be accomplished by receiving, processing and analyzing an electromagnetic field generated by the ESD events. In particular, an ESD Event generates an electromagnetic field and electrical signals in circuits that have very specific envelope characteristics, i.e. a very sharp or short rise time (typically, within 1 or 2 nanoseconds) and a very short duration. While known devices are capable of measuring and detecting the signal 10 shown in FIG. 1a, the known devices also typically detect and measure other non-ESD event transient signals, such as signals from stepper motors, relays, etc., whose characteristics are similar in spectrum and envelope to the ESD events. FIG. 1b illustrates a typical waveform 12 of these other transient signals. As seen, the signals 10, 12 both have short duration and their spectral content is somewhat similar. The difference, however, is not in the duration or spectral content of the signal, but in the details of signal envelope. In particular, the rise time of the signal from ESD events is extremely short and abrupt and the signal decay has a specific shape while signals from other sources (here forth called "EMI Events") have more gradual/longer rise times (approximately tens or hundreds of nanoseconds) and similarly more gradual decay time. Typical devices cannot completely separate such signals due to high bandwidth of its detection circuit that would capture EMI Events as well. Thus, it is highly desirable to be able to separate valid ESD Events from non-ESD EMI Events with the purpose of accuracy and validity of measurements.

FIG. 1c is a diagram illustrating an amplifier 18 made with a operation amplifier 20 ("op-amp.") The operational amplifier 20, which may preferably be a high-speed CMOS operation amplifier, exhibits a highly repeatable and reproducible phenomenon where a rapid transient signal with a rise time similar to ESD Events causes a much longer electrical signal at the output of the op-amp. Other circuitry based largely on CMOS devices can also exhibit this behavior. For example, audio amplifiers and pre-amplifiers, and video amplifiers may also exhibit similar behavior. Broadly, the circuits that exhibit this behavior may be known as low-bandwidth active electronic circuits. For purposes of illustrating, an operational amplifier embodiment of the invention will be described below, but the invention is not limited to the operational amplifier embodiment.

The amplifier 18 based on a high-speed CMOS op-amp 20 may further comprise resistors 22, 24 and 26 that are appropriately selected and a capacitor 28 that receive an incoming signal 40 that is received by an antenna 30. In this embodiment, the CMOS op-amp 20 has to have sufficient bandwidth (typically at least 40 MHz) but which is still significantly lower than the bandwidth of the ESD Event itself, and the bias resistor 26 is preferably of high value (typically, several MegaOhms). Then, if the signal received by the antenna 30 has the characteristics of an ESD Event signal 40, then the amplifier 18 generates a significantly longer decaying signal 42 with the magnitude proportional to the magnitude of the ESD Event signal. The output signal 42 is also influenced by the rise time of the input signal 40 since a shorter rise-time results in a higher amplitude output signal. The polarity of the output signal will be the same as the polarity of the input signal. In accordance with the invention, the circuit that uses the op-amp 20 does not have to be an amplifier since the circuit can be a simple follower, in which resistor 24 would be absent and resistor 22 would be a simple jumper of 0 Ohms value.

If the input signal 44 having a different waveform than the ESD Event signal 40 is received by the circuit 18, the rise-time of that input signal 44 may not be sufficient to generate the output signal as in the previous case. In addition, due to limited bandwidth of the op-amp, it may also be incapable of passing signal of high frequency such as 44. Therefore, an output 46 of the circuit 18 in response to the input signal 44 does not capture the presence of the input signal. Thus, as shown in FIG. 1c, the circuit 18 operates with the result being that only ESD Event signals are captured while EMI Event signals are largely ignored. Thus, the circuit operates as a discriminator/filter that is tuned to the characteristics of the ESD Event signal.

Figure 2:
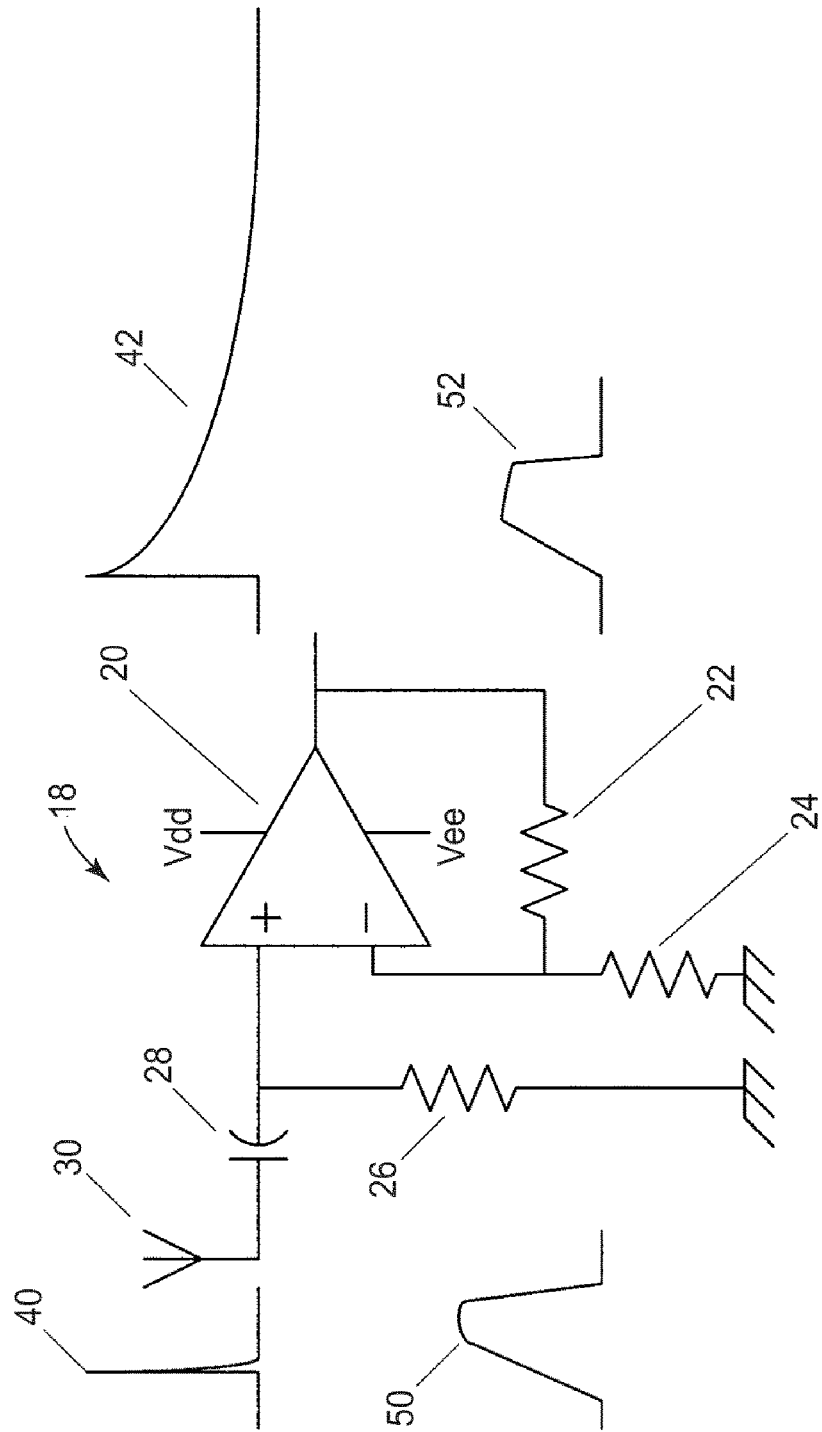
FIG. 2 illustrates the operation of the amplifier of FIG. 1 based on two different input signals.

FIG. 2 illustrates the operation of the amplifier of FIG. 1 based on two different input signals. The circuit would also operate to filter out an input non-ESD signal that has sufficiently low bandwidth that is within the range of the op-amp due to the characteristics of the output signal. For example, an input signal 50 has significantly different properties but has limited bandwidth that causes the circuit 18 to generate an output signal 52 due to the slow rise and fall times of the input signal. However, as seen, the signals produced by the ESD Event signal 40 and a non-ESD signal 50 at the output of op-amp 20 are very different as shown by output signals 42 and 52.

Figure 3:
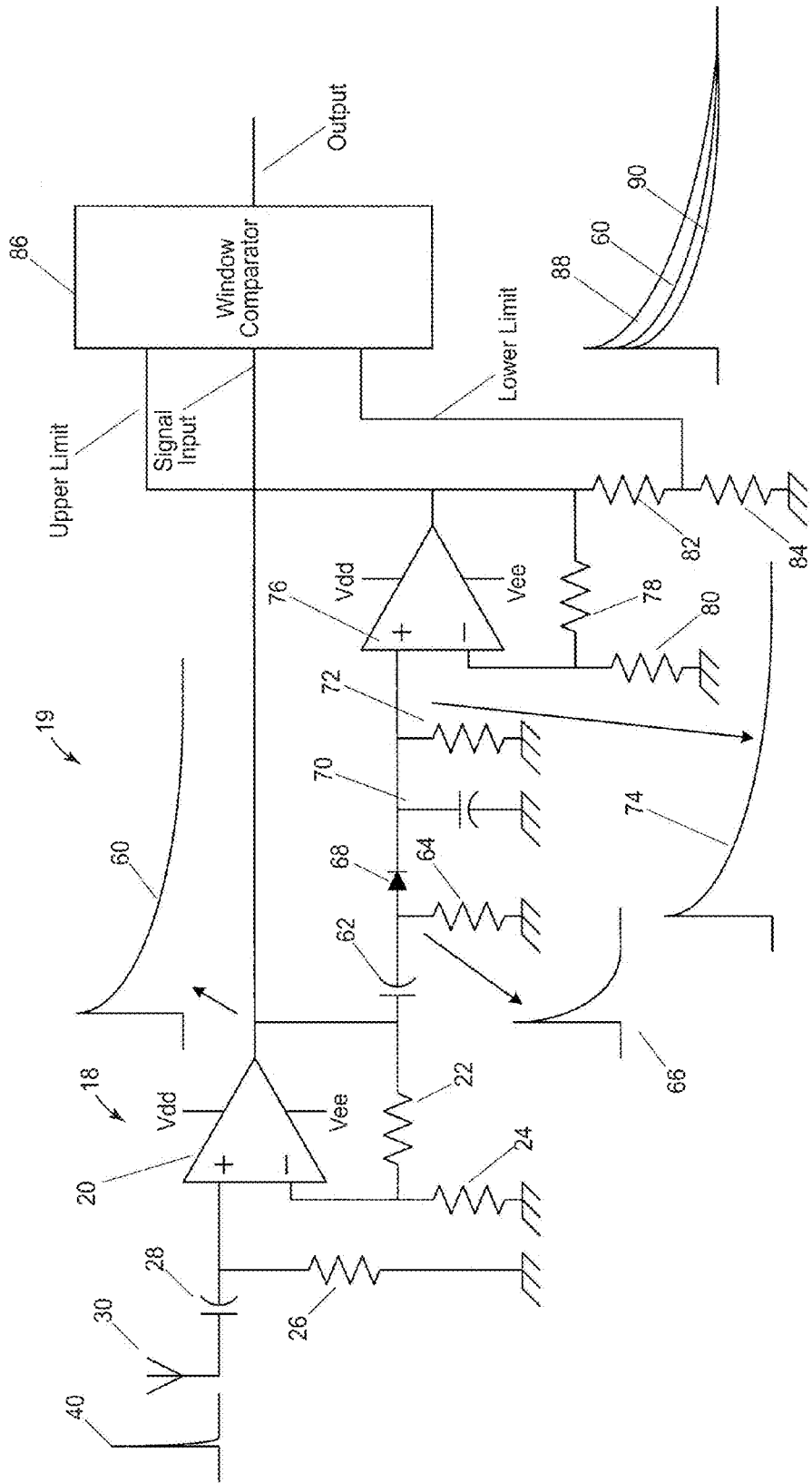
FIG. 3 is a diagram illustrating a device for electrostatic discharge event measurement device in accordance with the invention when an electrostatic discharge event occurs.

FIG. 3 is a diagram illustrating a device 19 for electrostatic discharge event measurement device in accordance with the invention when an electrostatic discharge event occurs. The device 19 in FIG. 3 is able to distinguish between the two output signals shown in FIG. 2. In this device 19, the circuit 18 with the op-amp 20 is used. As above, the input signal 40 generates an output signal 60 at the output of op-amp 20. The device 19 may further comprise a high-pass filter at the output of the op-amp 20 wherein the high-pass filter may include a capacitor 62 and a resistor 64. An output signal 66 from the high-pass filter has a sharp front and a very short duration that is independent on duration of the signal 60. The device 19 may further comprise a peak detector that includes a diode 68, a capacitor 70 and a resistor 72 connected as shown in FIG. 3 where the values of these components 68, 70, 72 are set such that an output waveform 74 closely represents the waveform of the output signal 60 in case of an ESD Event. The device 19 may further comprise an amplifier circuit that has an op-amp 76 with resistors 78 and 80 that buffers and amplifies the signal from the peak detector. The device 19 may have a voltage divider, connected to the output of the amplifier circuit, that comprises resistors 82 and 84. The signal 60 at the output of the op-amp 20 is connected to a central input of a window comparator 86. An upper limit input of the window comparator 86 is connected to the output of the op-amp 76 and a lower limit input of said window comparator is connected to the output of the voltage divider comprised of resistors 82 and 84. The window comparator is a known circuit that produces an out-of-bounds output signal when the envelope of the signal at the central input is between the envelopes of the signals at the lower and high limit inputs. Thus, as seen, If the input signal 40 has a waveform of an ESD Event signal that generates the output signal 60, the envelope of output signal 60 is below a signal 88 that is present at the upper limit input of the window comparator, but higher than the a signal 90 present at the lower limit input of the window comparator. In this case, the window comparator will not produce an "outside of limits" signal. It should be noted that the operation described above can be performed entirely or in part by a microprocessor and A/D converter where both have sufficient operational speed to process the signals. In a preferred embodiment, however, the filtering is done via hardware as shown in FIG. 3 so that a lower-grade microprocessor and A/D converter can be used which reduces the cost of the device. Instead of the window comparator that compares the envelope of the two signals, the invention may also compare the spectrum of the received signal to the spectrum of a known ESD event signal. The spectrum of the signal is a predetermined amount of energy at one or more frequencies.

Figure 4:
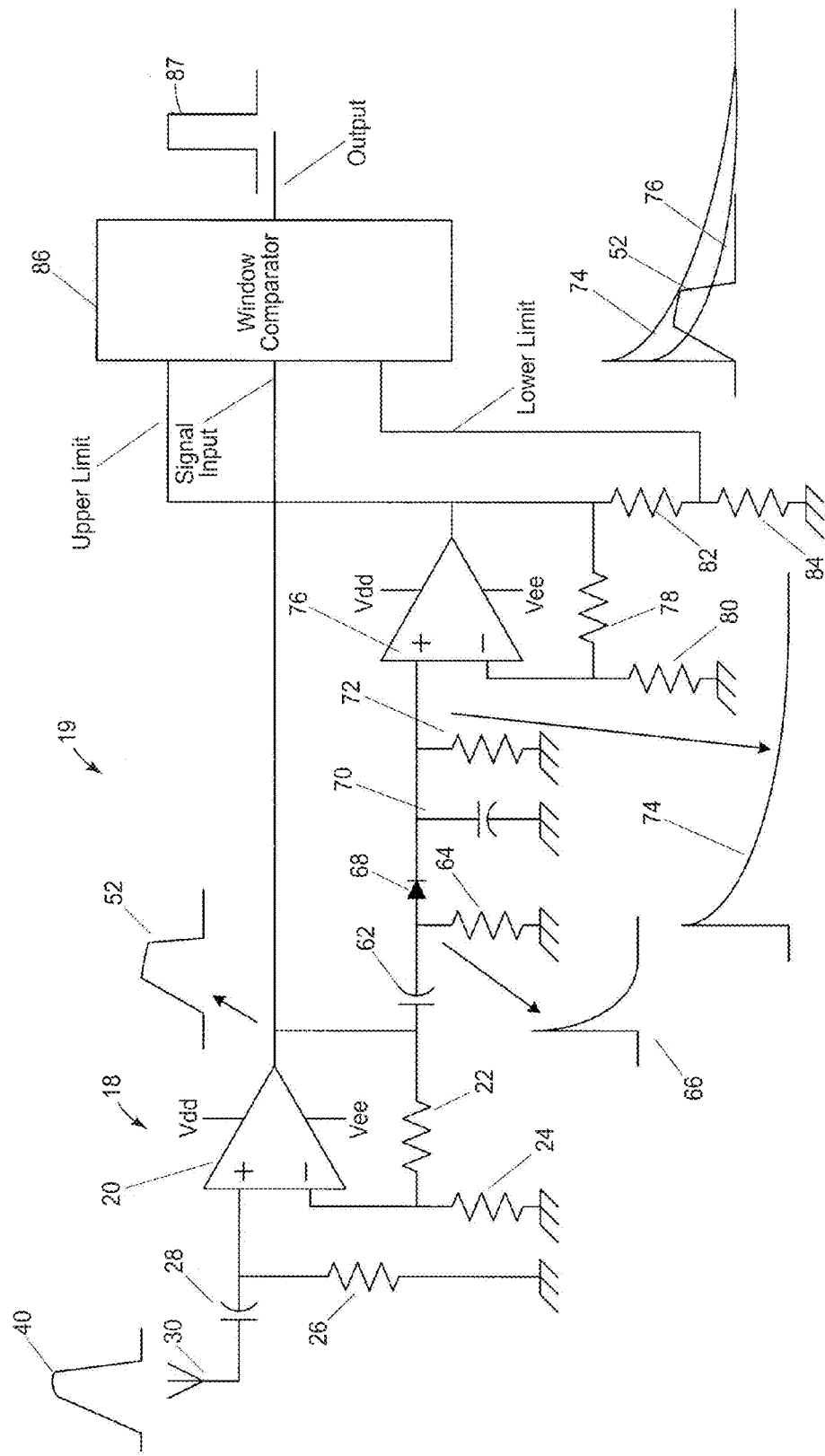
FIG. 4 is a diagram illustrating the device of FIG. 3 when a non-electrostatic discharge event occurs.

FIG. 4 is a diagram illustrating the device 19 of FIG. 3 and its operation when an EMI event occurs and an EMI event signal 50 is received by the device 19. In this case, a signal 52 that is provided to the central input of the window comparator is quite different from the one from the case of an ESD Event, but a signal 74 at the input of the op-amp 76 still retains the approximation of the waveform of the case of an ESD Event. Since the signal 52 is so radically different from the expected ESD Event-caused waveform 74, the signal triggers the window comparator 86 which in turn produces a pulse 87 indicating that the input signal has waveform different from the one of ESD Event and thus the registered event is a false one.

Figure 5:
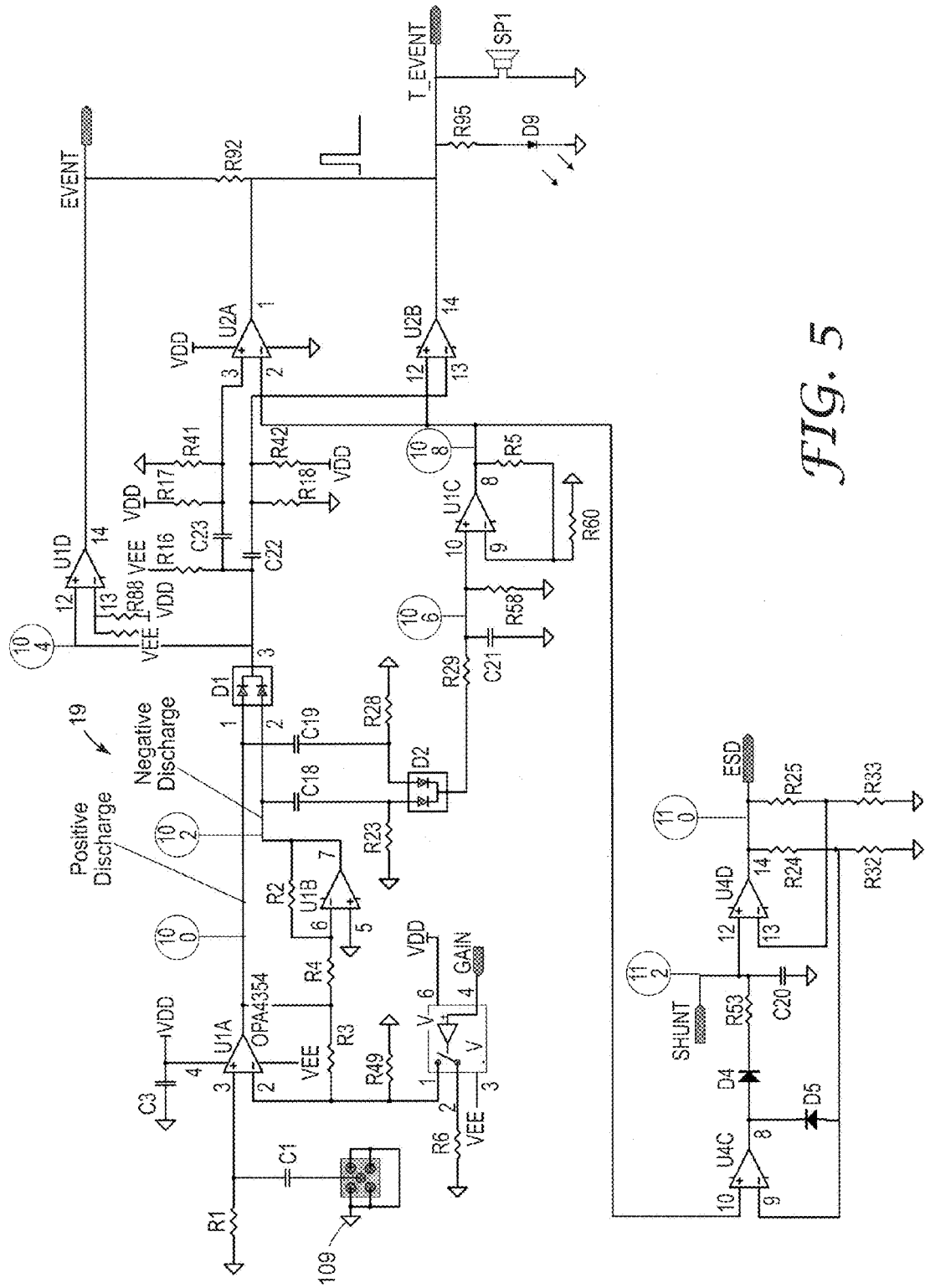
FIG. 5 is a diagram illustrating an example of an implementation of a preferred embodiment of the device in accordance with the invention.

FIG. 5 is a diagram illustrating an example of an implementation of a preferred embodiment of the device 19 in accordance with the invention. An antenna 109 is connected to a jack J1. The signal from J1 is sent via capacitor C1 to the non-inverting input of op-amp U1A. A resistor R1 provides DC bias to the op-amp U1A and the op-amp U1A is powered from positive and negative power supplies VDD and VEE respectively. The specific construction of power supply is not a subject of this invention and is not shown here. A set of resistors R3, R49 define the gain of the op-amp U1A as is well known. In order to be able to detect and measure ESD Events of various magnitudes, an analog switch U11 and a resistor R6 may be used to increase the gain of the op-amp U1A. The switch U11 is typically controlled by a microprocessor or by a manual switch. Within the scope of this invention, instead of a single step analog switch as shown, other means of gain control can be employed, such as a multi-step analog switch or a digitally-controlled potentiometer that can have more than one gain setting, or alternatively, there could be manual adjustment of gain by either potentiometer or a switch arrangement.

Figure 5A:
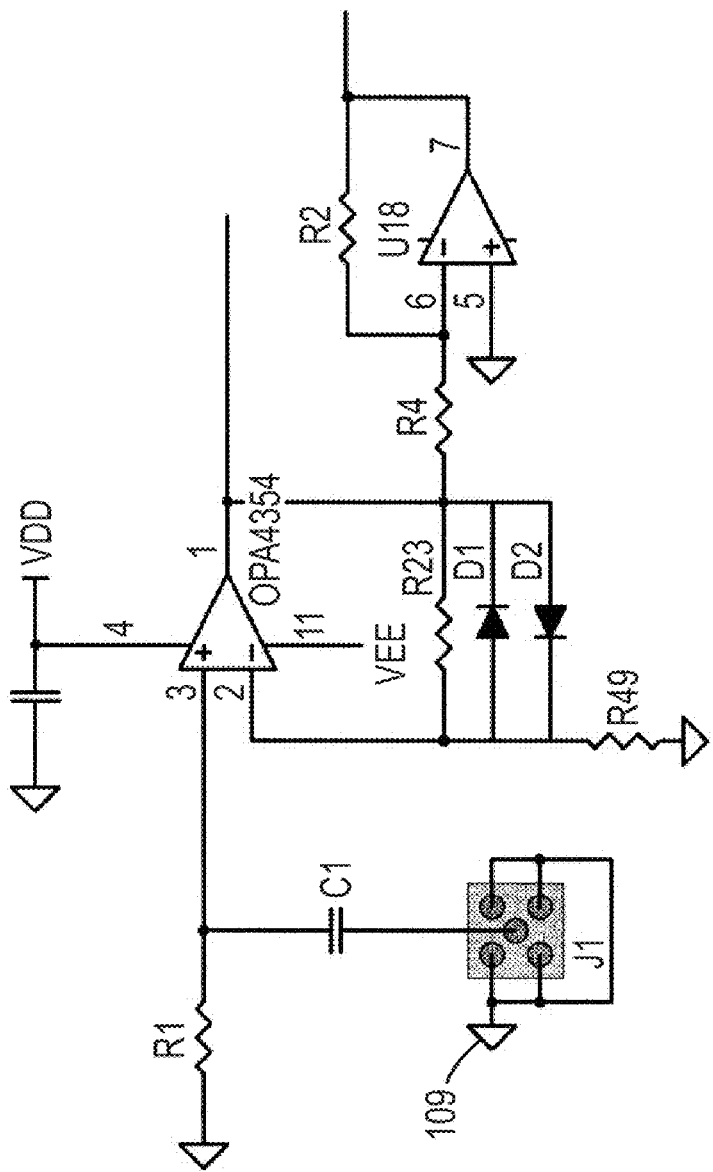
FIG. 5a illustrates a different implementation of the operational amplifier U1A shown in FIG. 5.

The op-amp U1A may also be implemented in a slightly different manner. In particular, FIG. 5a depicts the op-amp U1A with two back-to-back diodes D1 and D2 that provide a pseudo-logarithmic characteristic to the gain of U1A thus increasing its dynamic range without switching the gain.

While FIGS. 3, 4 and 5 depict an envelope detector based on hardware components, it should be noted that the envelope comparator function can be performed entirely or partially in software executing on a processor wherein the software operates in a similar way. The software may have a look-up table or a formula with the method that forms the upper and lower limits of the envelope and then the input signal is converted into a digital signal and compared to these levels.

Returning to FIG. 5, the output of op-amp U1A is connected to an inverter comprised of an op-amp U1B and resistors R2 and R4. This inverter is needed to assure that ESD Events of both polarities are measured equally well. A set of capacitors C18 and C19 and resistors R23 and R28 comprise high-pass filters and a diode D2 sums signals from both of them and, in combination with resistors R29 and R58 and capacitor C21, forms a peak detector. At the output of this peak detector, the signal closely resembles the one at the output of op-amps U1A or U1B when a genuine ESD Event signal is applied. An op-amp U1C with resistors R5 and R60 comprises an amplifier for the signal output from the peak detector. The output of this amplifier is connected to the central input of a window comparator that is comprised of a set of comparators U2A and U2B and resistor R92 wherein each comparator is preferably implemented using an op-amp. The outputs of op-amps U1A and U1B are also connected to the anodes of a dual diode D1 and the cathode of this diode is connected via a set of DC blocking capacitors C22 and C23 to a set of voltage dividers R17/R41 and R18/R42, respectively. These voltage dividers provide different DC levels for the high and low inputs of the window comparator (see input 3 of op-amp U2A and input 13 of op-amp U2B.)

If the signal received by the device 19 is a signal generated by an ESD Event, then the waveform at the output of op-amp U1C will be between the low and high voltages at the appropriate inputs of window comparator and the output of window comparator will not change state. If the input signal waveform is different from a waveform of an ESD Event, then the signal at the output of U1C will either exceed the high level input of window comparator or go below the low level input of said comparator. In either case, the window comparator will produce a pulse as shown in FIG. 5 indicating that the event registered is a false event and shall be ignored. It should be noted that, in accordance with the invention, the comparator may also be implemented entirely in software if a sufficiently fast microprocessor and A/D converter are used.

A comparator formed with an op-amp U1D and resistors R87 and R88 generate a pulse when an event signal exceeds a threshold set by resistors R87 and R88. This signal can be used to indicate that an event has occurred. The output of op-amp U1D is connected to resistor R92 so that, whenever there is a true ESD Event, signal T_EVENT generates positive pulse. This T_EVENT pulse can trigger visual alarm comprised of a resistor R95 and a diode D9 and/or audible alarm such as buzzer SP1. It should be obvious to skilled in art that various types of alarms could be employed, such as relay contacts, etc.

The measurement of the strength of the ESD Event can be made at various points in the device 19. For example, the outputs at points 100 through 108 (shown within circles in FIG. 5) can be used for measurements of the strength of ESD Events. The measurement at points 106 and 108, though not of direct signal, are nevertheless valid since, for legitimate ESD Events, the signal at said points 106 and 108 is a close representation of the original signal at the output of op-amp U1A. These outputs can provide signals to analog-to-digital converters or any other measurement devices, including bar graph indicators, analog meters and alike. If such measurement or indication device requires longer time due to slow speed of measurement and indicating devices, then a peak-hold detector comprised of op-amps U4C and U4D, diodes D4 and D5, resistors R53, R24, R25, R32 and R33 and a capacitor C20 will "stretch" the pulse to the required length. If a microprocessor is used for signal measurements, then it can discharge the capacitor C20 after the measurement has been successfully made so that the signal will be present on capacitor C20 for as long as the analog-to-digital signal capture takes place.

Figure 5B:
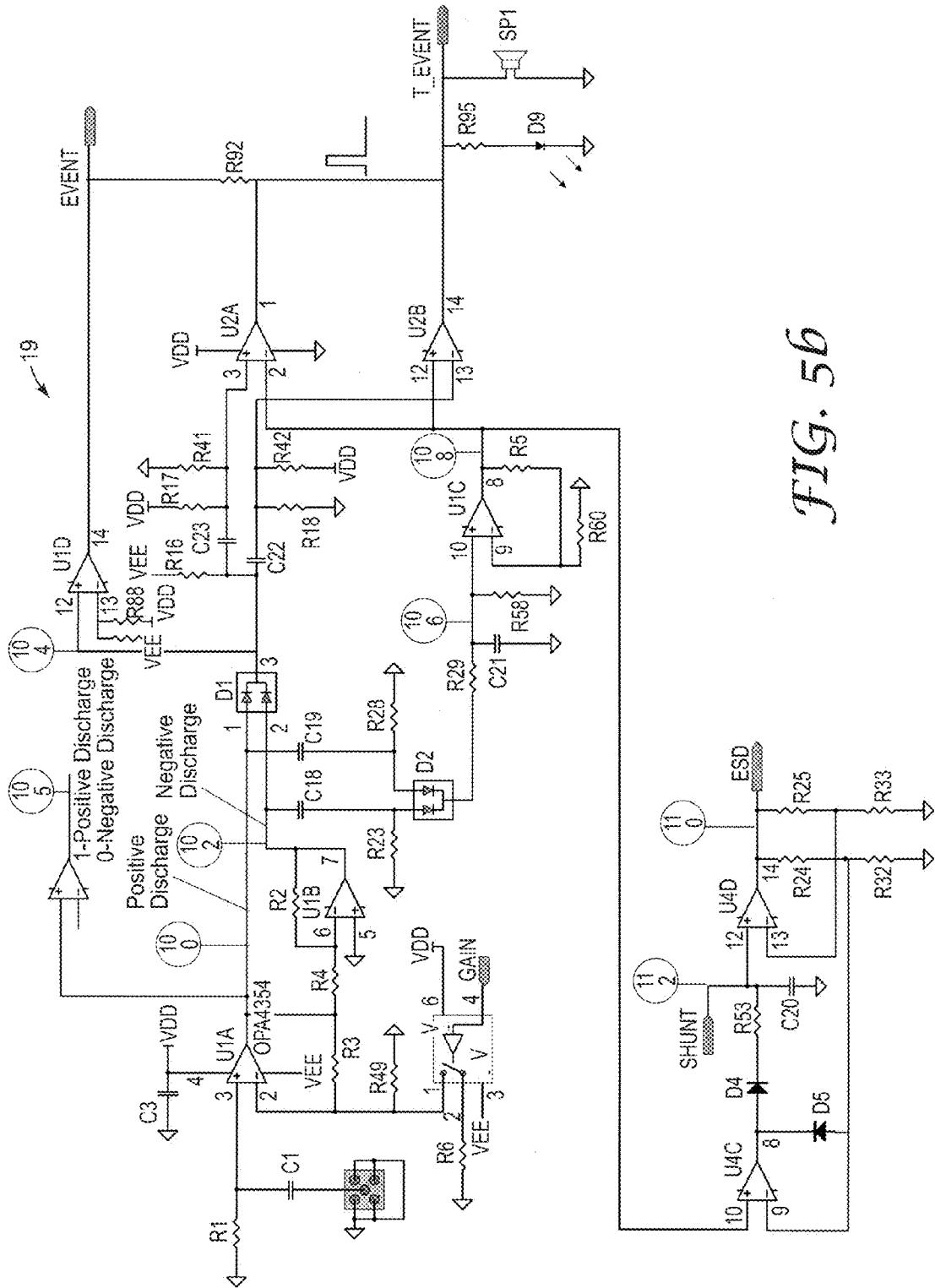
FIG. 5b illustrates another implementation of the device in accordance with the invention using an additional operational amplifier.

FIG. 5b illustrates another embodiment of the device 19 in which like elements have like reference numerals and operate in the same manner unless indicated otherwise. In this embodiment, an additional comparator U2C may be included so that the device is able to provide a signal indicating whether an ESD Event has positive or negative polarity. As seen in FIG. 5b, an output of first op-amp U1A is connected to a non-inverted input of an op-amp U2C which is configured to work as a comparator. A non-inverted input of this op-amp is connected to a voltage reference source that can be derived in any known way, such as resistive voltage divider, etc. In case of an ESD Event of positive polarity, the output pulse from the op-amp U1A, the output of comparator U2C will be positive indicating polarity of the event. In case of negative polarity of ESD Event, the output of comparator U2C will be zero. This way a determination of polarity of ESD Event can be achieved.

Figure 6:
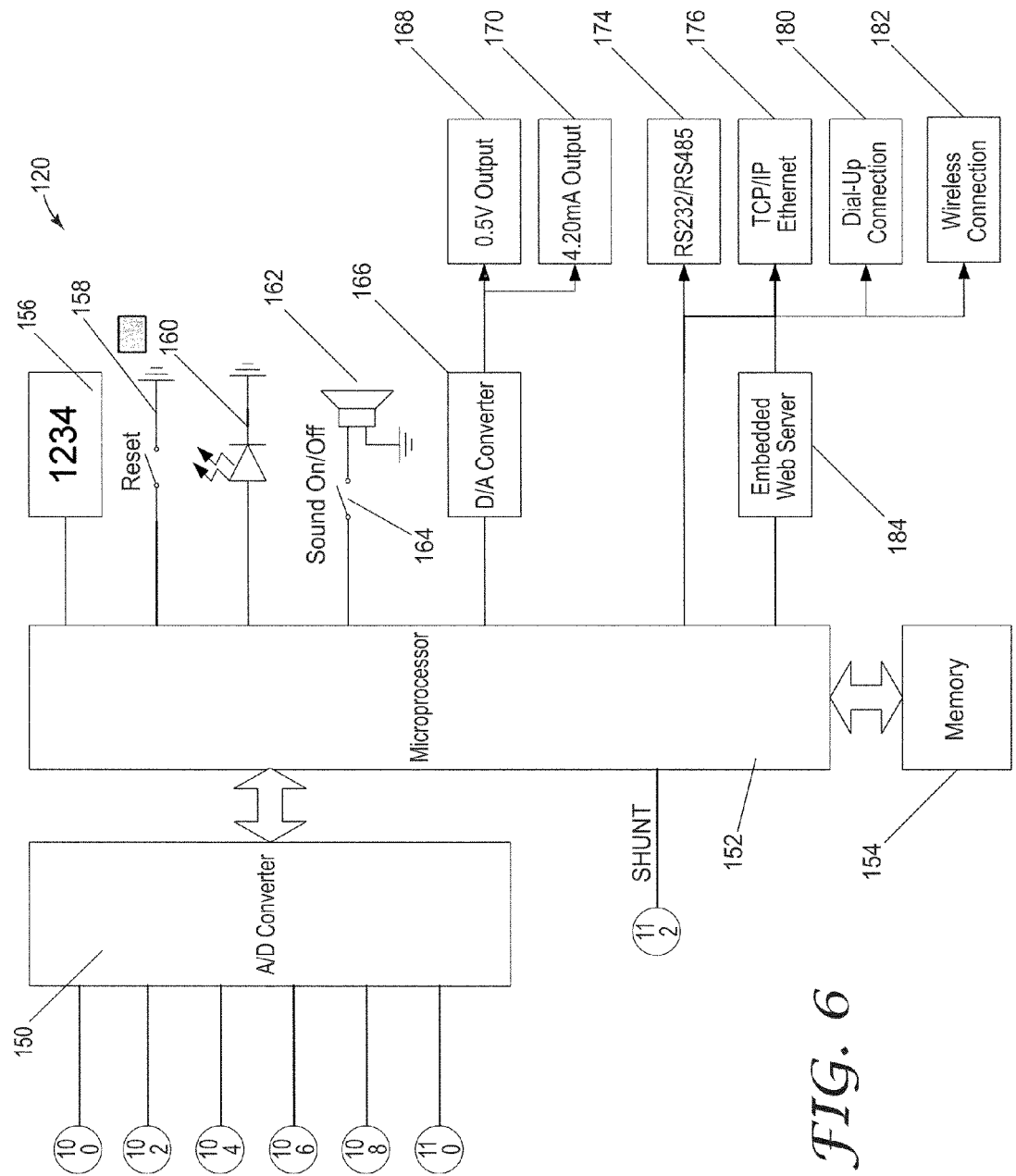
FIG. 6 is a microprocessor-based circuit that can be connected to the device shown in FIG. 5.

FIG. 6 is a microprocessor-based circuit 120 that can be connected to the device shown in FIG. 5. The microprocessor-based circuit is capable of measuring the signal, storing the data and communicating the data. The circuit 120 may comprise an analog-to-digital converter (A/D) 150 and can have any number of signal inputs as shown. The A/D converter converts the analog signals from the circuit shown in FIG. 5 into a digital signal as is well known. The output of A/D 150 is connected to a microprocessor 152 with associated memory 154. In a preferred embodiment, the A/D 150 may be embedded in microprocessor 152 itself. The microprocessor 152 performs measurements of the signal(s) and provides data to any or all of the following devices: a display 156 that can show either magnitude of the discharge or the count of discharges with a reset button 158, an LED 160, an audio buzzer 162 that can used with a sound on/off switch 162, or any other indicators and displays. In order to perform measurement of the signals and generation of data based on the signals, the memory 154 may store firmware/software that is executed by the microprocessor to perform the measurement and data generation operations. In addition, the circuit 120 may have a D/A converter 166 (also embedded in microprocessor 152 in the preferred embodiment) that can provide analog signal(s) to any of the external measurement devices, such as data acquisition system in various formats, such as 0 . . . 5V (168) or 4 . . . 20 mA (170). In addition, the microprocessor 152 can provide outputs in digital format, such as serial RS232 or RS485 174, TCP/IP/Ethernet 176, offer data in a dial-up connection 180 or via wireless connection 182, or even have an embedded web server 184.

While the above-described device rejects signals that have waveforms different from ESD Events, there are still some events that may have ESD-like waveform, such as relay contacts commutation, that may be recognized as legitimate ESD signals by the device described above. In order to discriminate against such non-ESD signals, another embodiment of the invention also may employ a method of pattern recognition. In particular, ESD Events are random by nature and all ESD Events are caused by discharge of accumulated static voltage. Static voltage is created by a tribocharge, or separation of two dissimilar materials. Due to the nature of mechanical movements, the charge created on components in a typical process is different every time. ESD discharges do not happen in a regular pattern on a highly repeatable basis. At the same time, signals from relay commutation, etc. occur highly regularly and often have similar magnitude. Thus, this embodiment of the invention distinguishes between ESD Events (which are random and of different magnitude each time) and non-ESD events (which are periodic and/or have a similar magnitude each time.)

Figure 7:
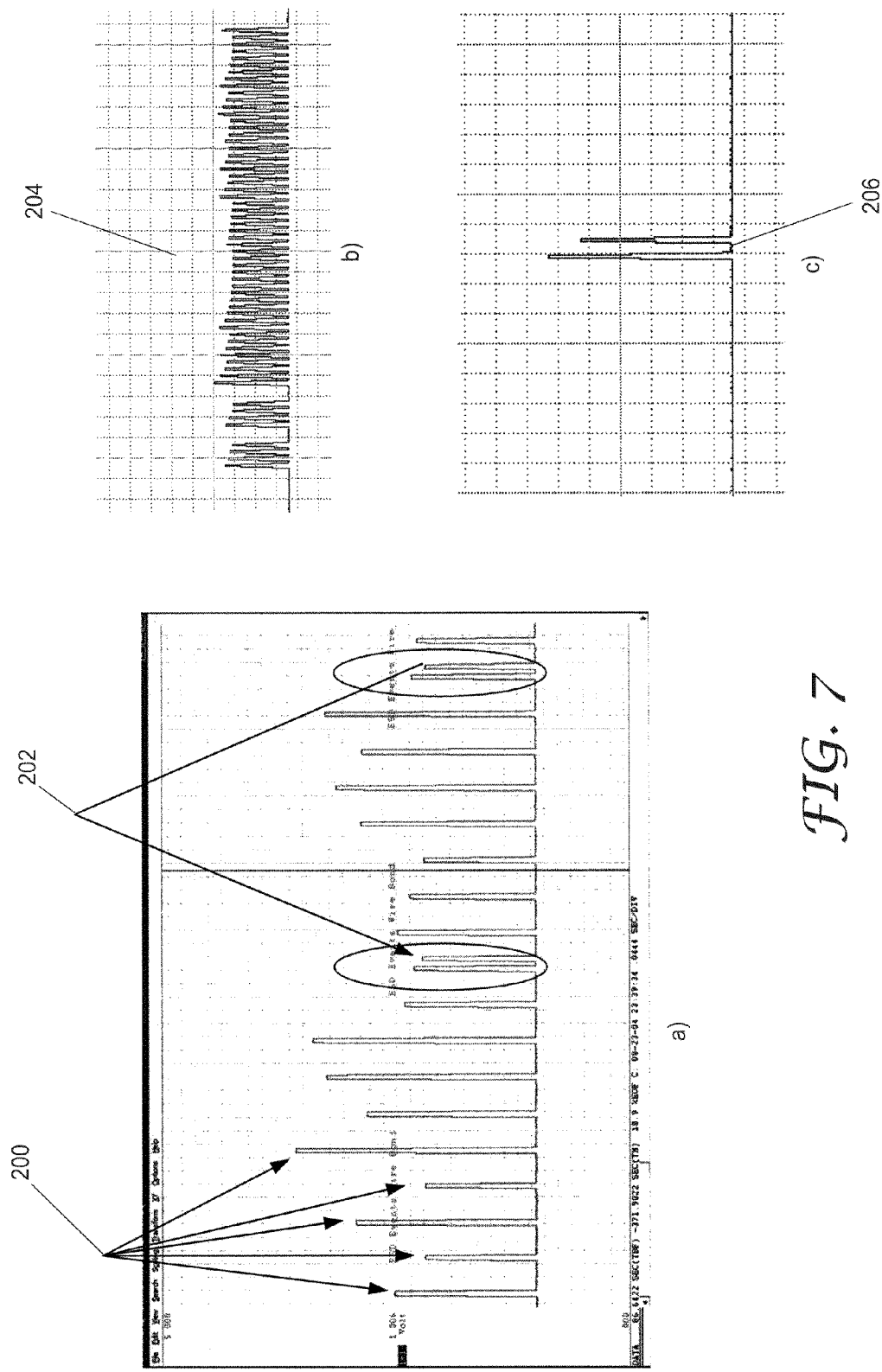
FIG. 7a illustrates a wire bond tool signal event.
FIG. 7b illustrates a plurality of events grouped together.
FIG. 7c illustrates another plurality of events grouped together.

FIG. 7a illustrates a wire bond tool signal event. As seen, a serial of signals 200 caused by a series of events occur on a highly-periodic basis even though they have different magnitudes. This signal pattern indicates a non-ESD Events. A series of signals 202, however, occur only sporadically and qualify as ESD Events. FIG. 7b illustrates a plurality of events 204 that are clustered together and are approximately similar in magnitude which would tend to indicate that the series of events are not ESD Events. FIG. 7c illustrates another plurality of events grouped together in which the events 206 in FIG. 7c are random and inconsistent in magnitude thus qualifying for being ESD Events.

Figure 8:
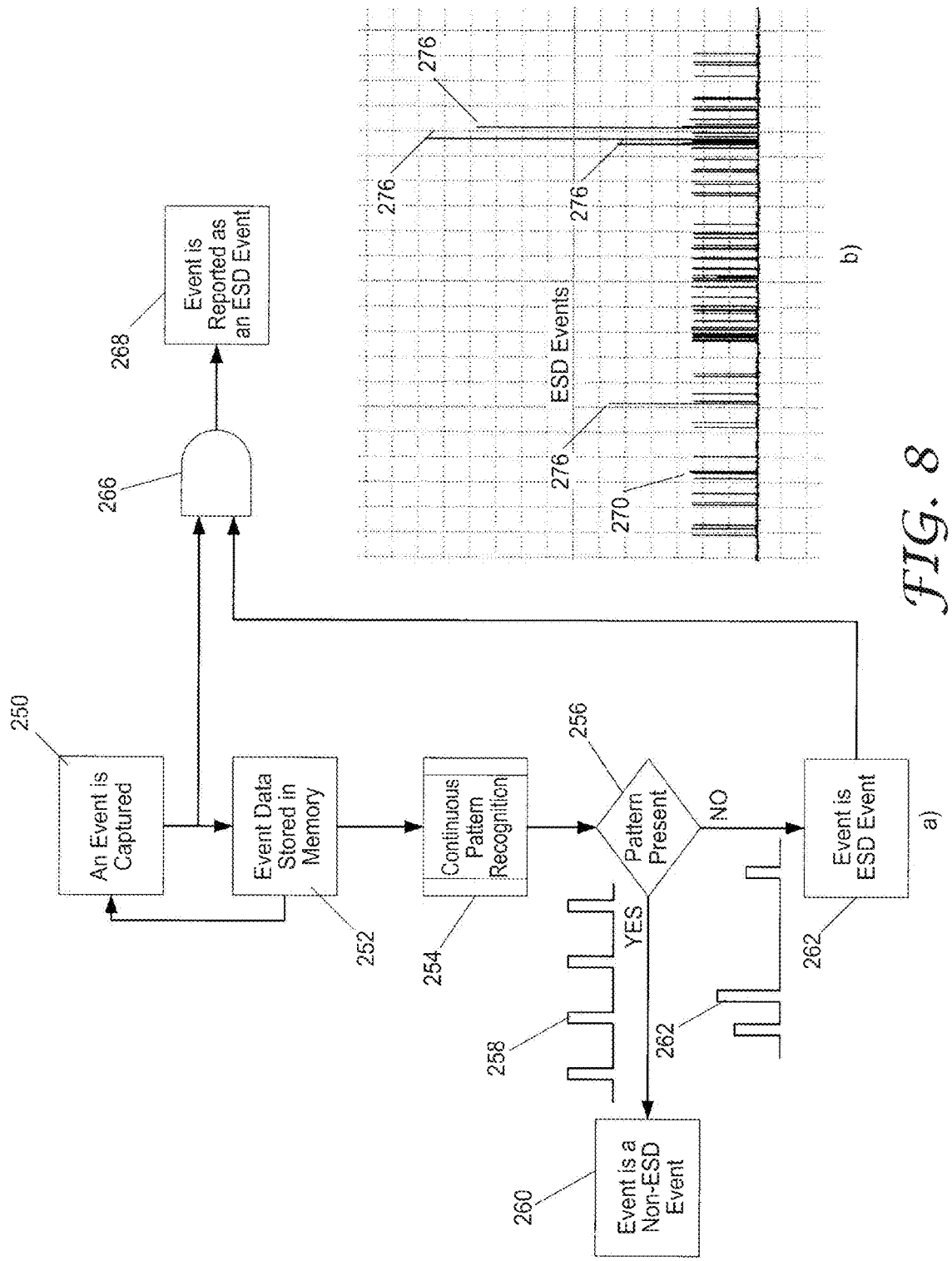
FIG. 8a illustrates a method for rejecting non-ESD events in accordance with the invention.
FIG. 8b illustrates how the method in FIG. 8a separates ESD events and non-ESD events.

FIG. 8a illustrates a method for rejecting non-ESD events using pattern recognition in accordance with the invention. In step 250, an event signal is captured and stored in memory, that could be configured as a FIFO or in other usable configuration, in step 252 continuously during the measurement process. In accordance with the invention, continuous pattern recognition is performed in step 254 on the stored event signals and if a pattern is identified in step 256, events that are part of the pattern are discarded in step 260 and only the events that are not part of the pattern are accepted in step 264. In step 266 and 268, the ESD Event is reported as an ESD Event.

FIG. 8b illustrates how the method in FIG. 8a separates ESD events and non-ESD events. In this figure, the output of the measurement device, such as output of 0 . . . 5V 168 of FIG. 6 is shown. As seen, a series of event signals 270 (from a series of events) are of approximately the same amplitude and are highly repeatable. This indicates that these events are caused mostly by operation of machinery and not by static electricity. These events will be rejected by the method of FIG. 8a. A series of events 276, however, are random in time and are random in magnitude so that this series of events qualifies them as genuine ESD Events and they will be accepted by the method. In combination with the approach described in FIG. 3, this method provides highly accurate detection and measurement of ESD Events while rejecting other signals.

Figure 9:
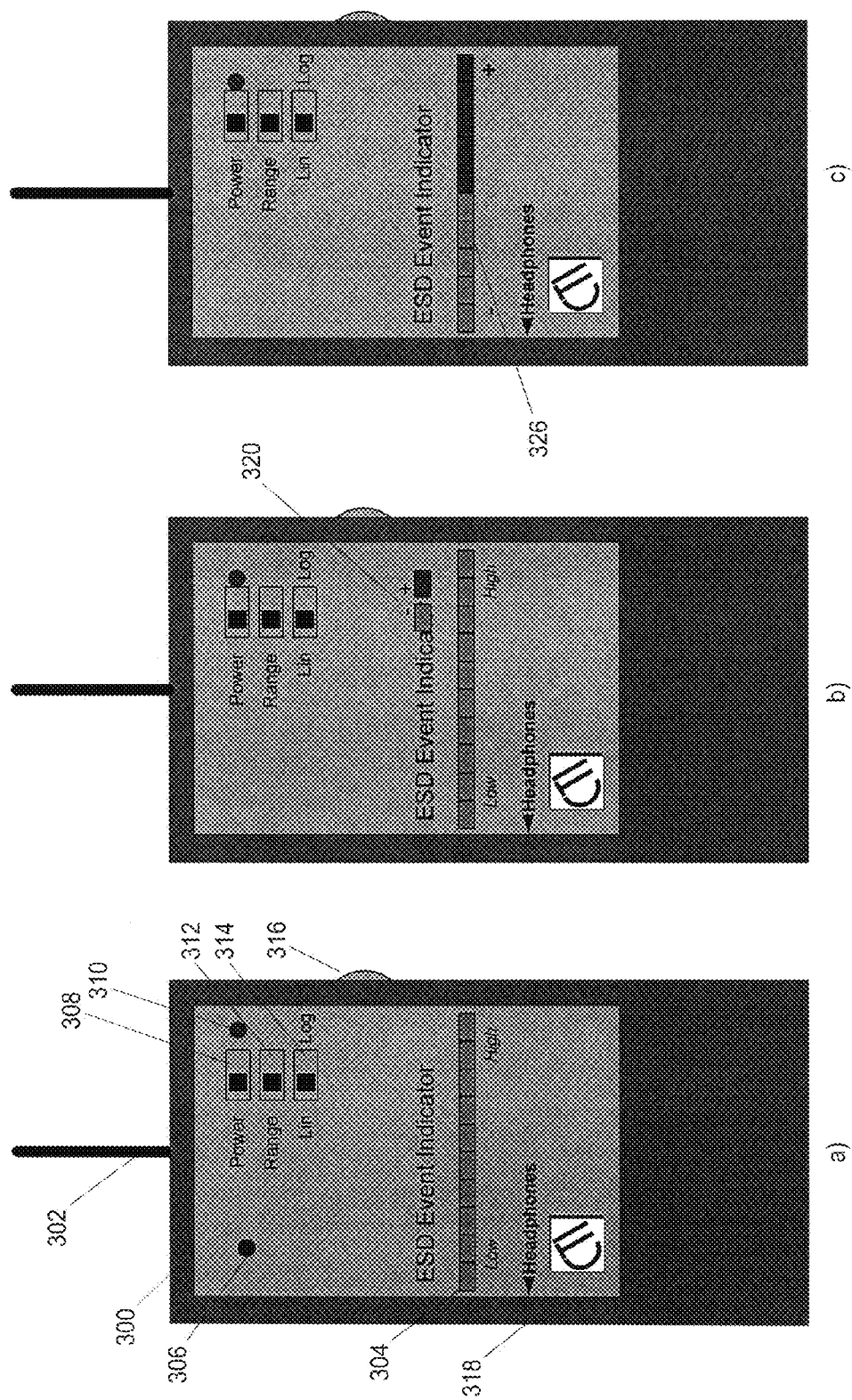
FIG. 9a is a hand-held device in accordance with one embodiment of the invention.
FIG. 9b is a hand-held device in accordance with another embodiment of the invention.

FIG. 9a is a hand-held device 300 in accordance with another embodiment of the invention. This device 300 has an antenna 302, a LED indicator 304, an audio indicator 306, power switch 308, power indication LED 310, range switch 312 that allows measurement of ESD Events over a wide range, a Logarithmic/Linear scale change switch 314, alarm level adjustment switch 316 and a headphone jack 318. Obviously, not all shown elements have to be in the device in order to utilize the proposed invention. In this particular case, LED bar indicator shows relative strength of ESD Events. Alarm level potentiometer adjusts the level above which an ESD Event is displayed and/or the sound alarm is on. The handheld device 300 also incorporates the device 19 shown in FIG. 5 and the method shown in 8a that perform the discrimination and other processing of the incoming signals. It should be obvious to a person skilled in art that not only portable devices, but also bench-top devices with interface to a data acquisition system can be implemented using the proposed invention.

FIG. 9b is the hand-held device 300 in accordance with another embodiment of the invention. In this embodiment, the device 300 has two additional LEDs 320 that indicate the polarity of ESD Event as it occurs. FIG. 9c is another embodiment in which the device 300 has an LED bar graph 326 that indicates separately the magnitude of the positive and negative polarity of discharges. The magnitude of the negative polarity of the discharge may be displayed on the left-hand side of the LED bar graph while the positive polarity of the discharge may be displayed on the right-hand side of the LED bar graph.

Users often need to know the magnitude of the event correlated with the strength and the model of the discharge as defined by common practice, such as by ESD Association. Such practice defines several models of discharges, such as CDM (Charged Device Model), HBM (Human Body Model) and several others. The strength of the discharges is shown in terms of static voltage causing the discharges, such as, for example, 200V CDM, or 2000V HBM. In order to present measurements of ESD Events done by receiving electromagnetic fields from the discharge in this form, an instrument must be characterized for specific models of discharge and based on measurement distance from the discharge. The devices shown in FIGS. 9A, 9B, 9C, 12 and 13 may be used to measure an emission/input signal wherein the emission/input signal may be any electromagnetic emission, electric field or magnetic field emission as well as any sound or ionizing radiation emission, such as an alpha, beta or gamma ray.

Figure 10:
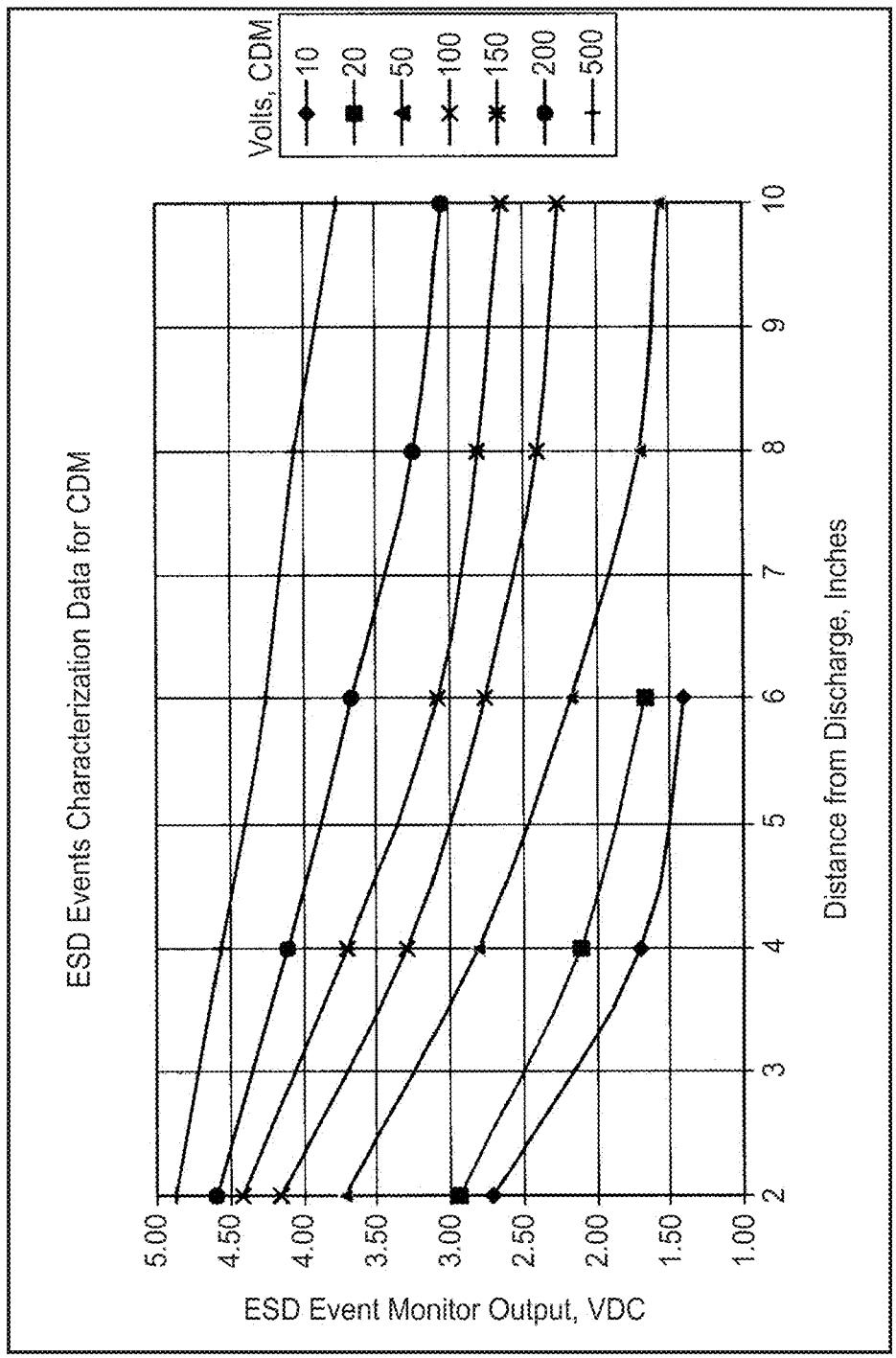
FIG. 10 is a characterization chart of ESD events.

FIG. 10 shows an example of such characterization data with an ESD Event monitor for CDM-type discharge. The output of this monitor is 0 . . . 5V. As seen from characterization chart in FIG. 10, a monitor with the antenna placed at 5" from the event would generate 3V output signal if the event was caused by 100V static voltage and discharges in a way compliant with CDM model. In essence, a 100V CDM ESD Event would cause a 3V output signal in a monitor placed 5" away from it. Similarly, a 200V CDM ESD Event would cause a 3.7V output signal in a monitor placed 6" away from it. Such characterization is specific to a particular monitor.

Figure 11:
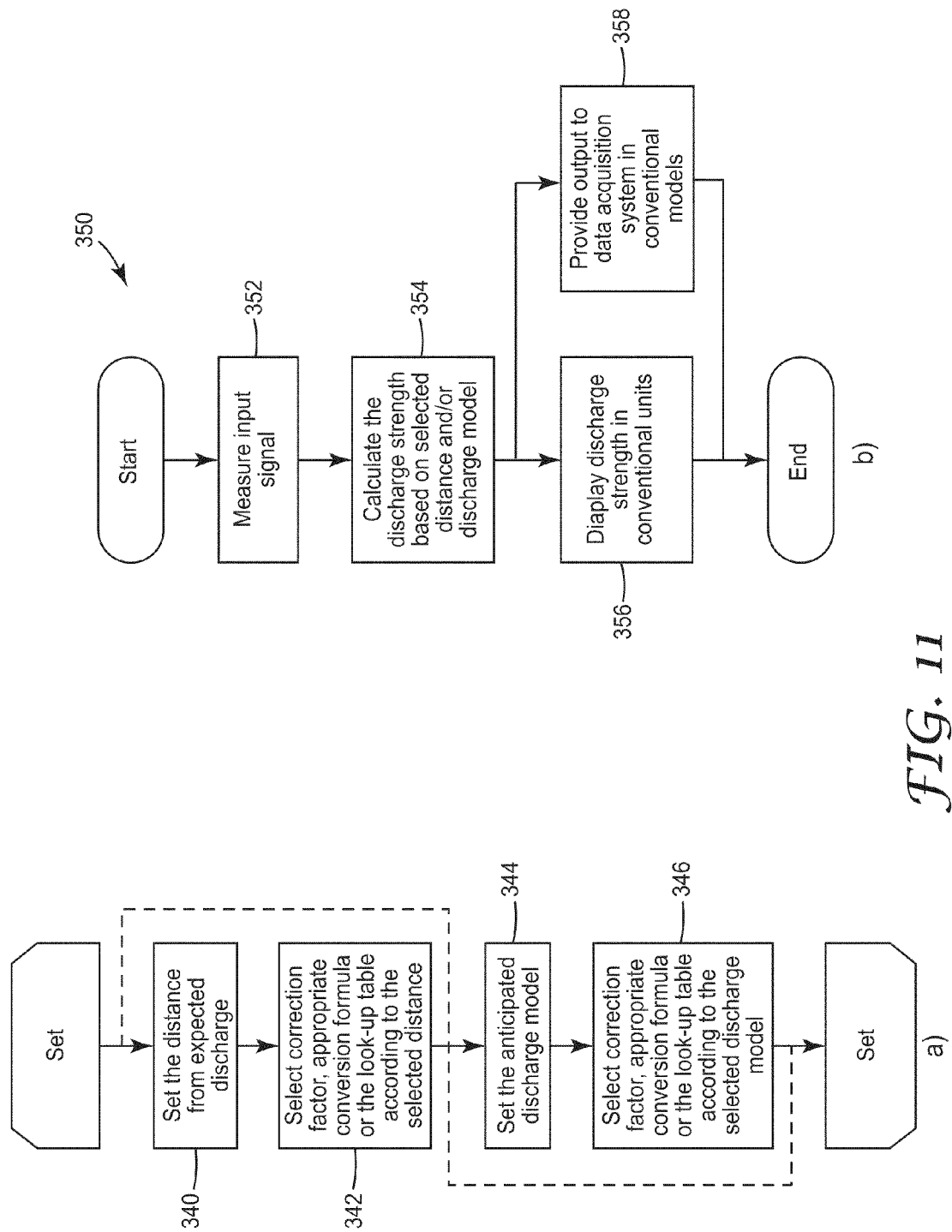
FIG. 11a illustrates a method for initial set-up in accordance with the invention.
FIG. 11b illustrates a method for operation of the device in accordance with the invention.
Figure 12:
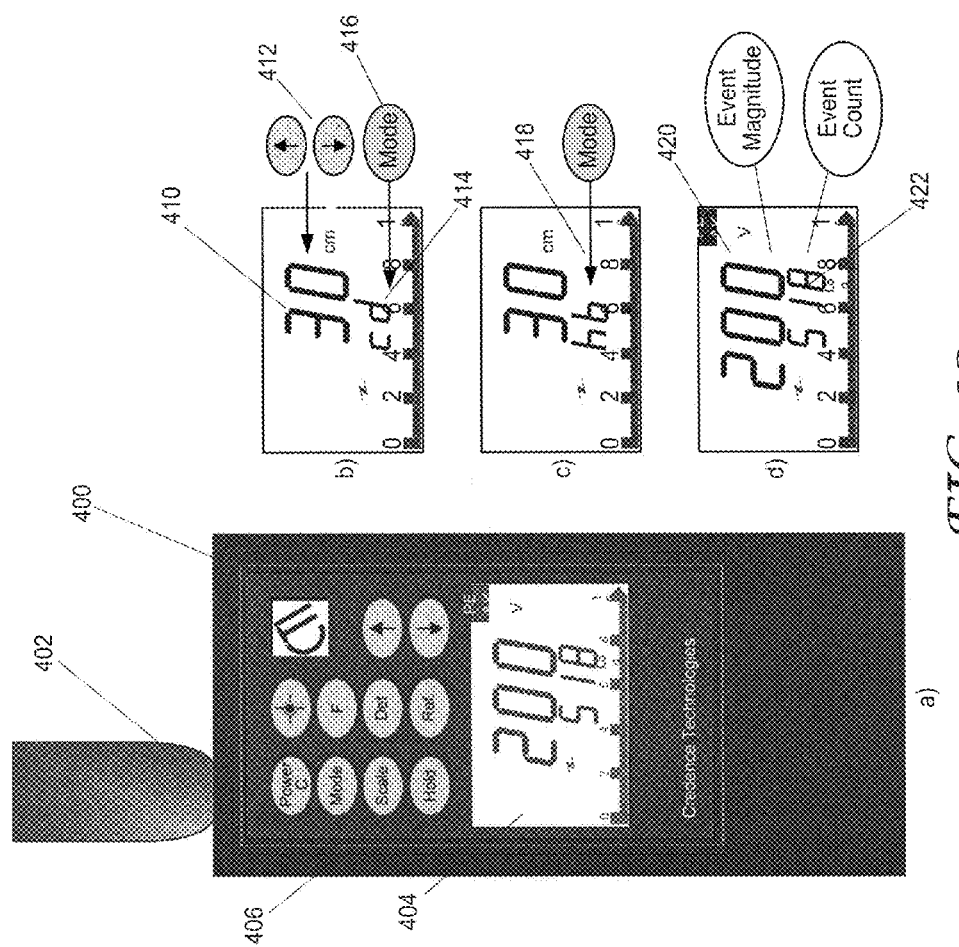
FIG. 12a illustrates an example of another embodiment of the device in accordance with the invention.
FIG. 12b illustrates a screen shot of the device of FIG. 12a during set-up.
FIG. 12c illustrates a screen shot of the device of FIG. 12a during HBM discharge model selection.
FIG. 12d illustrates a screen shot of the device of FIG. 12a showing the measurement results.
Figure 13:
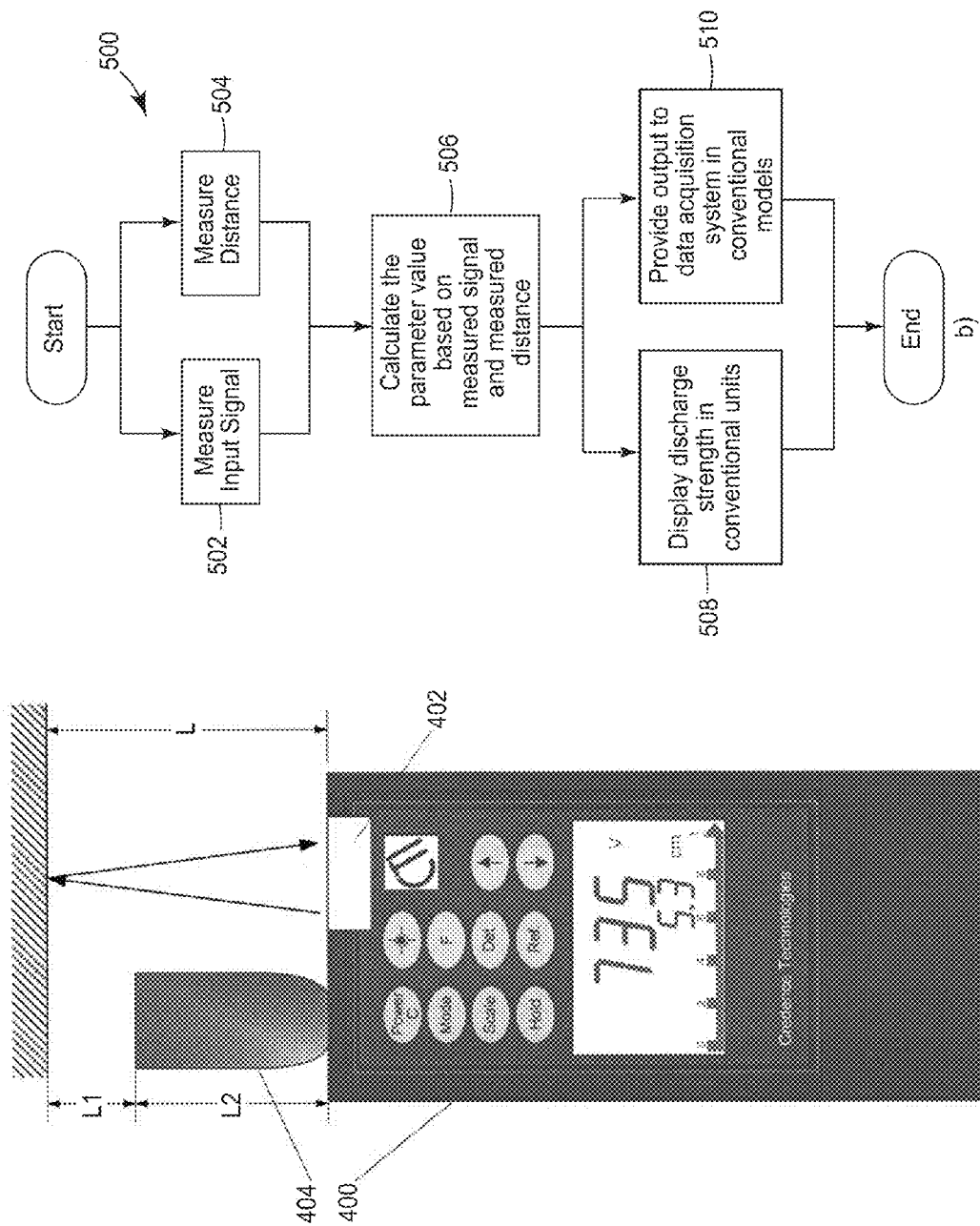
FIG. 13a illustrates an example of another embodiment of the device in accordance with the invention.
FIG. 13b illustrates a method for measurement in accordance with the invention.

FIGS. 11a and b shows how the characterization data can be used for direct display of the event parameters. FIG. 11a shows the initial setup that must be done before the measurements. In step 340, a distance from the anticipated discharge is set. In many cases it is known where the discharges will occur, such as in automated tools that handle semiconductor devices. In step 342, the correlation factor, appropriate conversion formula or the look-up table according to the selected distance is determined. In step 344, if the ESD Event measurement device is expected to measure more than one model of discharge, this model should be set as well. In step 346, the correlation factor, appropriate conversion formula or the look-up table according to the selected discharge model is determined. Once these parameters are set, then appropriate adjustments to the readings can be made. Depending on construction of the device, such adjustments can be made in analog form, such as gain changes, or in digital form by altering calculations formulae or changing the look-up table parameters.

FIG. 11b illustrates a method 350 for operation of the device in accordance with the invention once the distance and discharge model have been set. Once the input signal is measured in step 252, its value is recalculated in accordance to the correction factors for a particular distance and a particular discharge model in step 354. The recalculation may also take into account any characterization data of the device. Once recalculated, the data can be displayed in step 356 and/or sent to a data acquisition system in step 358.

FIG. 12a illustrates an example of another embodiment of a device 400 in accordance with the invention that employs this method. The ESD Event meter 400 has an antenna 402, a display 404 and control keys 406. FIG. 12b illustrates a screen shot of the device of FIG. 12a during set-up wherein the distance from the discharge 410 is set using keys 412. The model of discharge 414 is set using key 416. This particular screen shows the CDM discharge mode. FIG. 12c illustrates a screen shot of the device of FIG. 12a during HBM discharge model selection. FIG. 12d illustrates a screen shot of the device of FIG. 12a showing the measurement results after the setup. In this particular case, an upper row 420 depicts discharge strength of 200V (CDM model). A lower row 422 depicts count of discharges. It should be obvious to a person skilled in art that instead of a hand-held meter, a stationary or a mobile monitor performing essentially the same function can be used within constraints of the proposed invention and the display can be augmented and/or replaced by an output to a data acquisition system via numerous available means.

FIG. 13a illustrates an example of another embodiment of the device in accordance with the invention. In this embodiment, instead of the manual setting of the distance, an automatic means of distance measurements is incorporated into the device. An automatic distance measurement device 402 is shown in FIG. 13a. The device 402 can measure the distance by various means, such as by using ultrasonic, light-based, mechanical (extending rod) or any other means to determine the distance. The light-based distance measurement unit may be any unit that is able to measure a distance using light energy, such as an infrared distance measurement unit. FIG. 13b illustrates a method for measurement 500 in accordance with the invention. In this method, the input signal and distance are measured, preferably, simultaneously in steps 502 and 504, unless the monitor is stationary and the distance does not change often. In step 506, the measured value is recalculated based on measured distance and the resulting data presented on the display in step 508 and/or sent to a data acquisition system in step 510. It should be noted that not only ESD Event measurements can benefit from this approach, but other distance-dependent measurements such as static voltage measurements can benefit from that. Currently, static voltmeters have to be at a fixed distance from the measured surface (typically, 1"). Using this methodology and such device, accurate measurements can be done at any reasonable distance.

Figure 14:
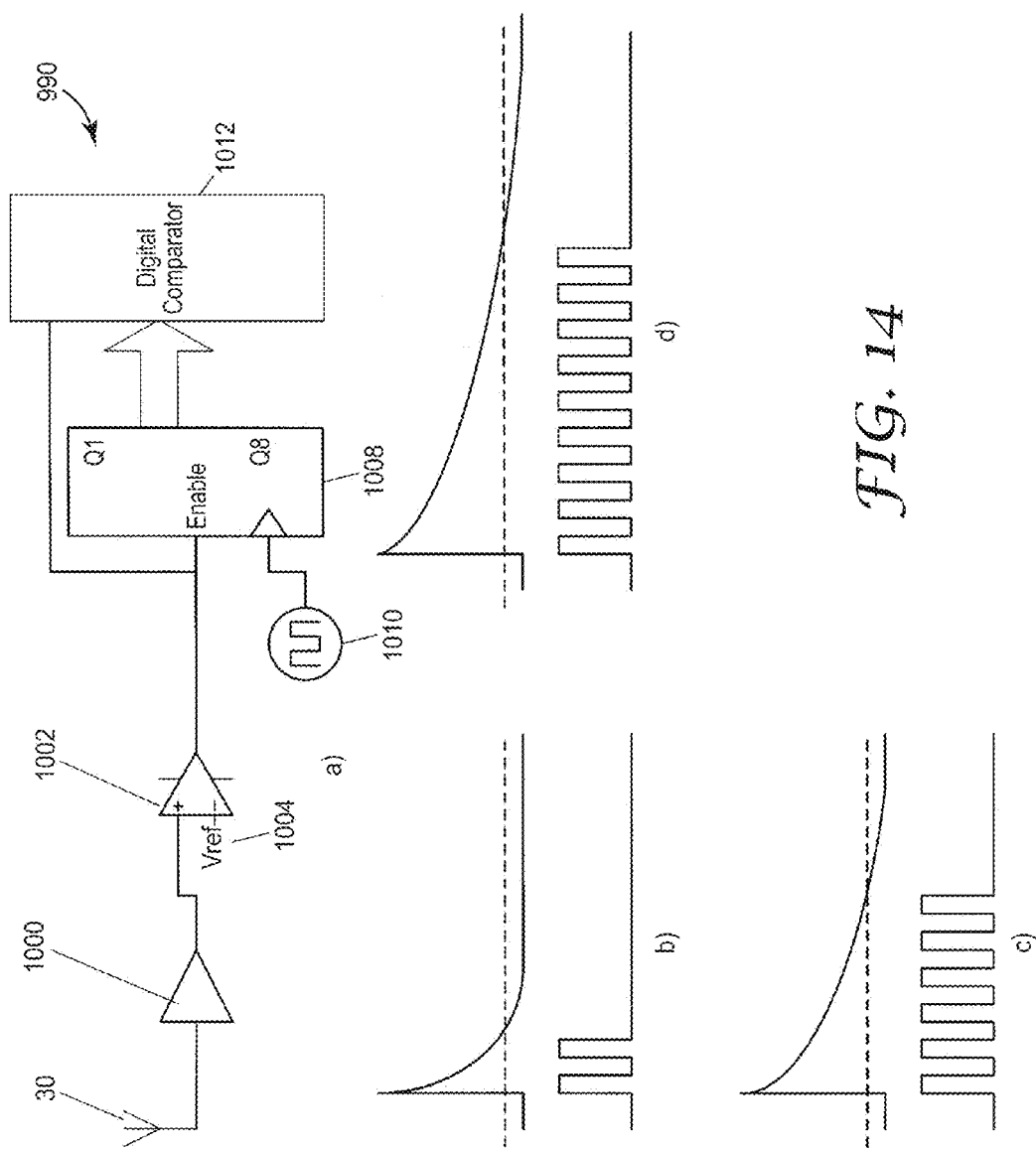
FIGS. 14a-14d illustrate an implementation of a circuit in accordance with the invention for determining the type of discharge and discharge waveforms examples, respectively.

In accordance with the invention, it is often desirable to be able to have a device/circuit that determines the type of discharge that has occurred wherein the types may include charge device model (CDM), machine model (MM) or human body model (HBM). FIG. 14a illustrates an embodiment of a circuit 990 in accordance with the invention for determining the type of discharge and FIGS. 14b, 14c and 14d show typical waveforms for a COM, MM and HBM discharge, respectively. As shown in FIG. 14b, the Charge Device Model discharge is the shortest one lasting typically few nanoseconds, while Machine Model (MM) discharge lasts typically 20 nanoseconds (FIG. 14c) and Human Body Model (HBM) discharge lasts 100 nanoseconds or even longer as shown in FIG. 14d.

As seen in FIG. 14a, an antenna 30 is connected to the input of an optional high-frequency preamplifier 1000 that amplifies weak signals. The output of the preamplifier 1000 is connected to a first input of a comparator 1002. A second input of the comparator is connected to a voltage reference 1004 that could be implemented in various well known manners. An output of the comparator is connected to an Enable input of a counter 1008 in a way that, in the absence of a signal output from the comparator, the counter is effectively disabled. When a discharge occurs, the signal at first input of the comparator 1002 will exceed the voltage reference level (Vref) and the comparator will generate a signal at its output. This signal will enable the counter 1008 which then win begin a count of pulses from an oscillator 1010 connected to the count/clock input of the counter. When the input signal drops below the threshold of comparator 1002, the count stops. The output of the counter 1008 may be connected to an input of a digital comparator 1012 that makes a determination of type of discharge based on the number of pulses that occur which corresponds to the duration of the input signal pulse as shown in FIGS. 14b-14d wherein a longer duration pulse (FIG. 14d) results in a greater number of pulses. Thus, the digital comparator compares the number of pulses generated during the input signal and compares that number to a stored number of pulses for each type of discharge and determines the type of discharge. Once the determination is completed, the counter is reset (not shown). In this embodiment, the circuit 990 is implemented in an inexpensive way using common components. It should be noted that the function of the digital comparator 1012 can be performed by a microprocessor instead.

Figure 15:
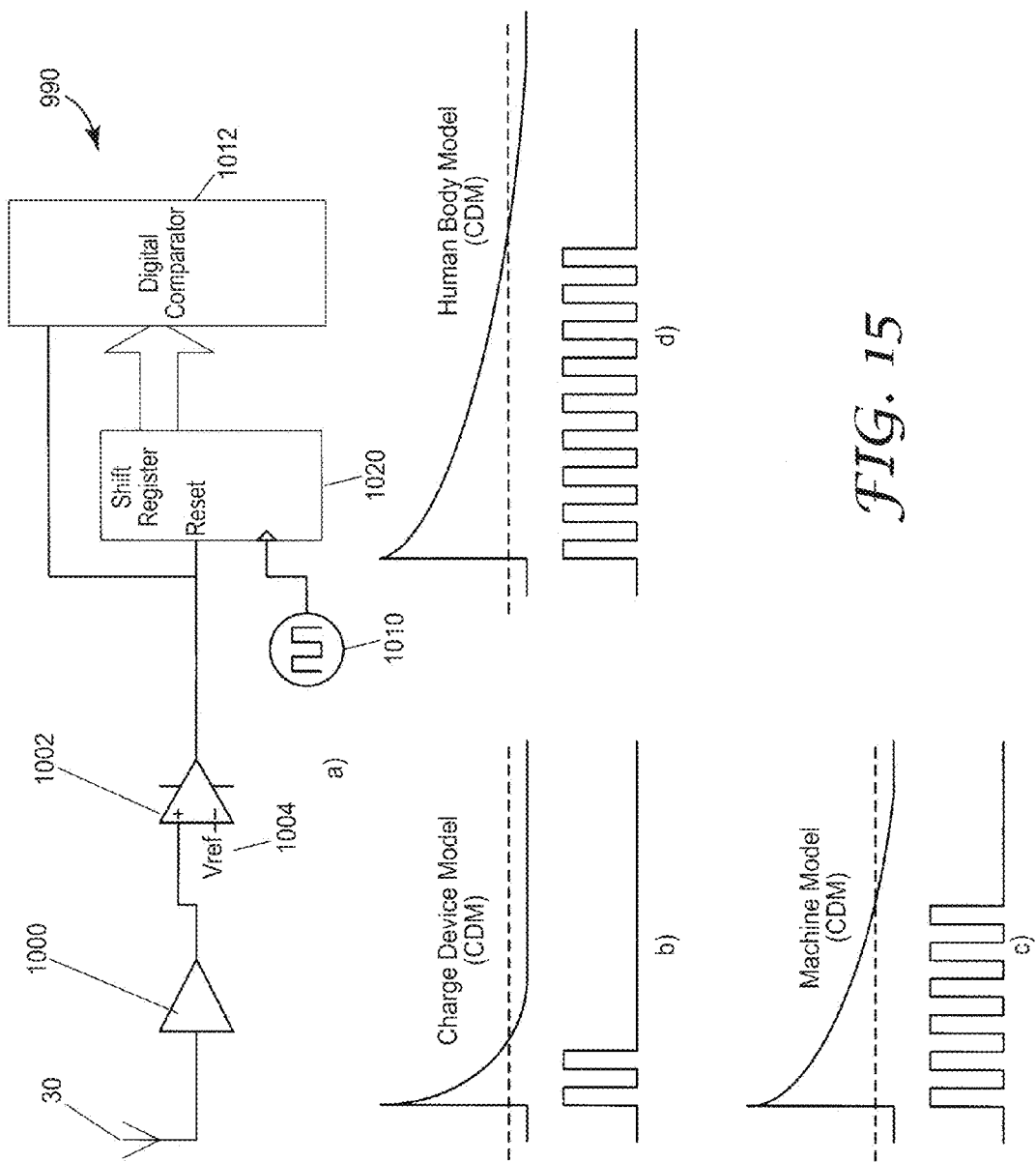
FIGS. 15a-15d illustrate another implementation of a circuit in accordance with the invention for determining the type of discharge and discharge waveforms examples, respectively.

FIG. 15a depicts another embodiment of the circuit 990 in which like elements have the same reference numbers and perform similar functions unless indicated otherwise. In this embodiment of the circuit 990, the counter 1008 may be replaced by a shift register 1020 wherein during the input signal duration, the shift register 1020 generates a series of "1"s and wherein the determination of the type of discharge is made based on number of "1"s at the output of register by the digital comparator 1012 whose function can be performed also by a microprocessor (not shown). FIGS. 15b-d illustrates the waveforms that are substantially similar to FIGS. 14b-d.

Figure 16:
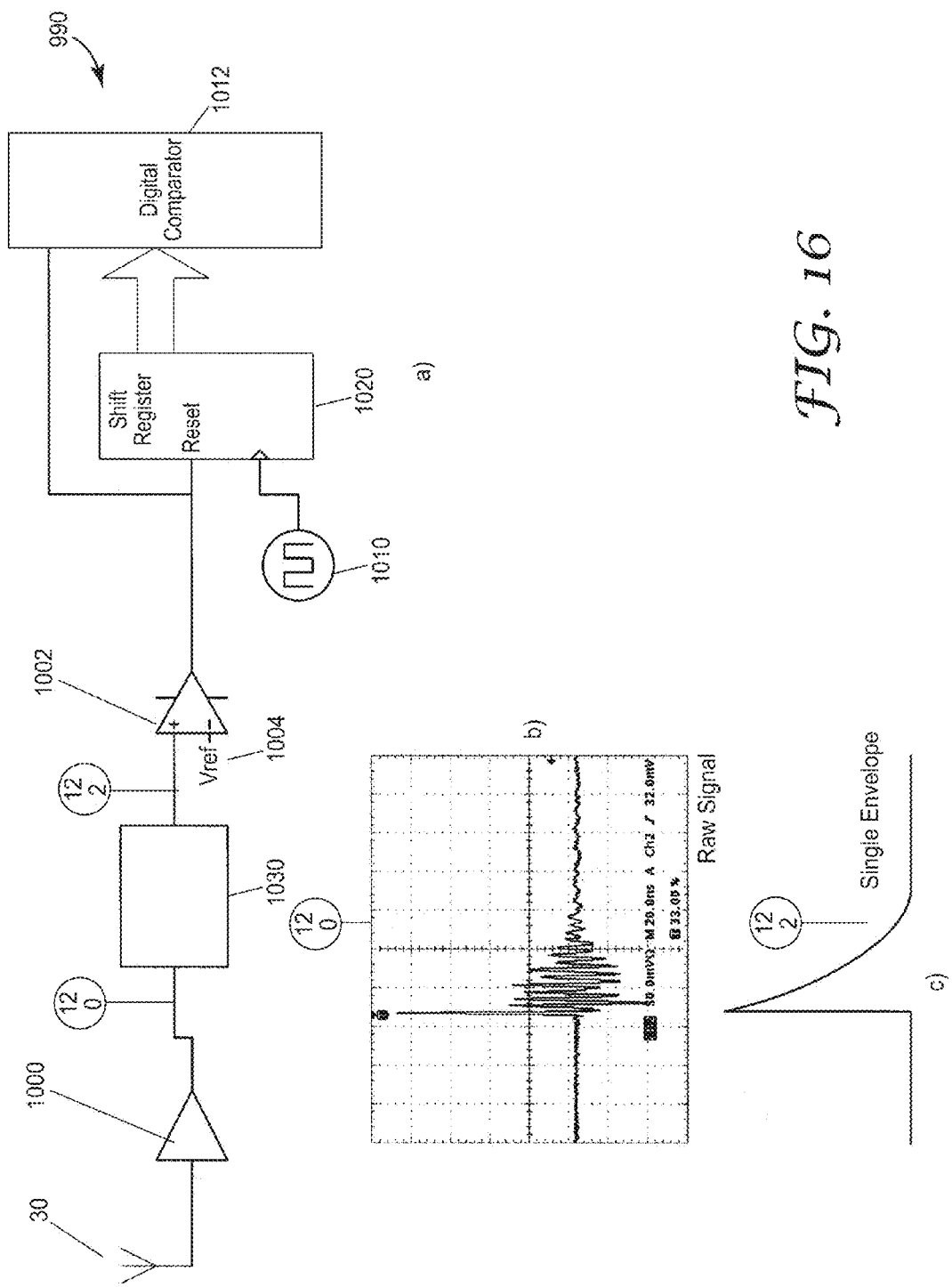
FIGS. 16a-16c illustrate another implementation of a circuit in accordance with the invention using a envelope detector for determining the type of discharge and discharge waveforms examples, respectively.

FIG. 16a depicts the circuit 990 of FIG. 14a or 15a with the addition of an envelope detector 1030. The envelope detector 1030 converts a complex waveform of the discharge (such as that shown in FIG. 16b) to an easier to manage waveform shown in FIG. 16c. This envelope detector can be of any suitable type and its specific construction is not discussed herein in any detail since envelope detectors are well known.

Figure 17:
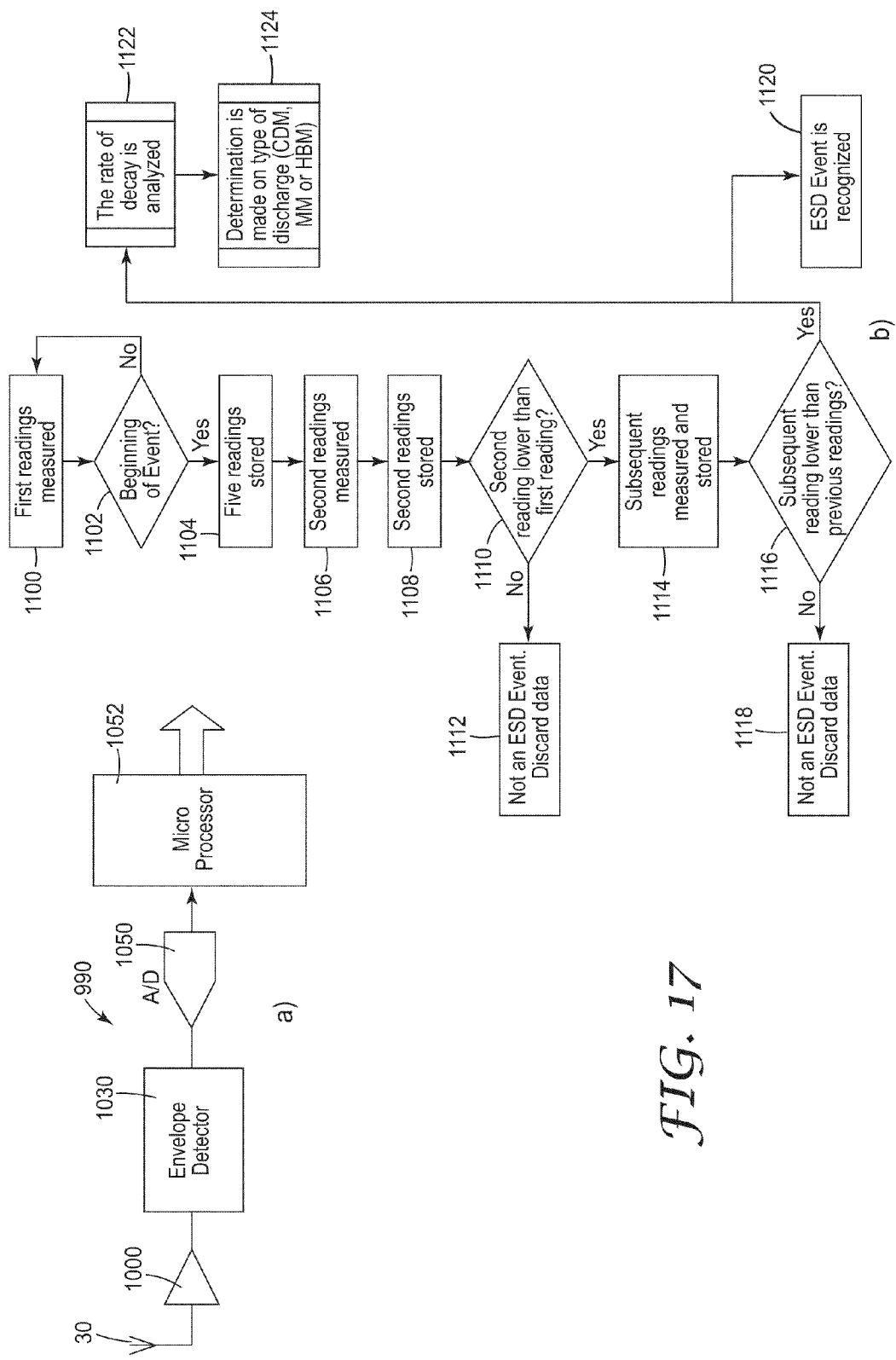
FIGS. 17a and 17b illustrate another embodiment of the circuit for determining the type of discharge and the method of operation, respectively.

FIG. 17a illustrates another embodiment of the circuit 990 of FIG. 14a or 15a with the envelope detector 1030 wherein the antenna 30 of FIG. 17a is connected to the optional preamplifier 1000 and further to the optional envelope detector 1030. The output of the envelope detector 1030 is connected to a high-speed analog-to-digital converter 1050 that converts this signal into digital format that is passed onto a microprocessor 1052.

FIG. 17b illustrates the operation of the circuit shown in FIG. 17a. In steps 1100 and 1102, the first readings are measured and the microprocessor (based on embedded software being executed by the microprocessor) determines if the event is beginning. In step 1104, once the beginning of an event is determined (a sharp jump in the input signal), the magnitude of the first sample is stored in the memory associated with the microprocessor that may be a register or a separate memory device. In step 1106, another measurement is done very shortly after the first one and then stored in step 1108. In step 1110, if the second reading is the same or higher than the first reading, then the event is deemed a non-ESD Event and is discarded in step 1112. If the second reading is lower than the first one, then the first reading in memory is replaced with the second one and subsequent readings are measured and stored in step 1114. After that, every consecutive sample is compared with the previous sample. If a magnitude of a consecutive sample is the same or higher than the previous sample, the event is not an ESD Event and is discarded in step 1118. If the consecutive sample is lower in amplitude than the previous sample until the input signal reaches zero or near zero, the entire event is considered to be an ESD Event in step 1120. In step 1122, the rate of decay of the signal is analyzed by the software of the microprocessor and, in step 1124, a type of event can be determined. The accuracy of this determination improves if the absolute amplitude of the signal is taken into account.

FIG. 18*a* illustrates another embodiment of the circuit 990 of FIG. 14*a* or 15*a* with the envelope detector 1030 wherein the antenna of FIG. 18*a* is connected to the optional preamplifier 1000 and further to the optional envelope detector 1030. In this embodiment, a peak-hold detector 1060 may be used instead of the more expensive A/D converter 1050 in FIG. 17*a*. The peak-hold detector 1060 may be on any suitable construction and may have a clock signal source 1062 and may hold the highest level of the signal that is output from the envelope detector 1030 and be able to be reset on the clock pulses. Then, the output from the peak-hold detector is compared to the output signal of the envelope detector (or the signal from the antenna if the preamplifier and envelope detector are not used) by a comparator 1064. The output from the comparator 1064 is fed into a microprocessor 1066 that operates in the same manner and has the same functions as the microprocessor shown in FIG. 17*a*.

FIG. 18*b* illustrates the operation of the circuit 990 shown in FIG. 18*a* which is similar to the operation of the circuit of FIG. 17*a* except that it does not require an expensive and power-consuming A/D converter. The disadvantage of this method as compared to the one of FIG. 17*b* is that the absolute magnitude of the signal cannot be measured. In step 1130, the maximum signal level of the input signal is captured by the peak-hold detector and the method goes through a wait step 1132. In step 1134, the current value of the input signal is compared to the signal level stored in the peak-hold detector by the comparator 1064. In step 1136, the software of the microprocessor determines if the new signal is lower than the stored signal based on the output of the op-amp 1064. In step 1138, if the new signal is greater than or equal to the stored level, then the input signal is not from an ESD Event. However, if the new signal is lower than the stored signal, then the new signal is stored in the peak-hold detector in step 1140. In step 1142, the software of the microprocessor counts the number of cycles that it takes to bring the signal to zero and then determines the type of discharge based on the counted number of cycles in step 1144.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A device for identifying an ESD Event, comprising:
    a receiver that receives an input signal;
    an identifier unit that compares the received input signal to a predetermined signal in order to determine if the input signal is an ESD event signal; and
    an output circuit for outputting an identification signal if the input signal is identified as an ESD event signal,
    wherein the received input signal has a spectrum having a predetermined amount of energy at one or more frequencies and wherein the identifier unit further comprises a spectrum detector that compares the spectrum of the received input signal to a spectrum of an ESD event signal.

2. The device of claim 1 wherein the received input signal has a signal envelope and wherein the identifier unit further comprises an envelope detector that compares the signal envelope of the received input signal to a signal envelope of an ESD event signal.

3. The device of claim 2, wherein the envelope detector further comprises a window comparator circuit.

4. The device of claim 1, wherein the receiver further comprises an antenna.

5. The device of claim 1, wherein the received input signal has a signal envelope and wherein the identifier unit further comprises a processor that executes a pattern recognition software module that compares the input signal envelope pattern to a predetermined signal envelope.

* * * * *

UNITED STATES PATENT AND TRADEMARK OFFICE
CERTIFICATE OF CORRECTION

| | | |
|---|---|---|
| PATENT NO. | : 7,795,875 B2 | Page 1 of 1 |
| APPLICATION NO. | : 12/403514 | |
| DATED | : September 14, 2010 | |
| INVENTOR(S) | : Vladimir Kraz | |

It is certified that error appears in the above-identified patent and that said Letters Patent is hereby corrected as shown below:

On the Title Page,
Item [74], *Attorney, Agent, or Firm,* delete "Kuster" and insert --Kusters-- therefor.

Figure 18:
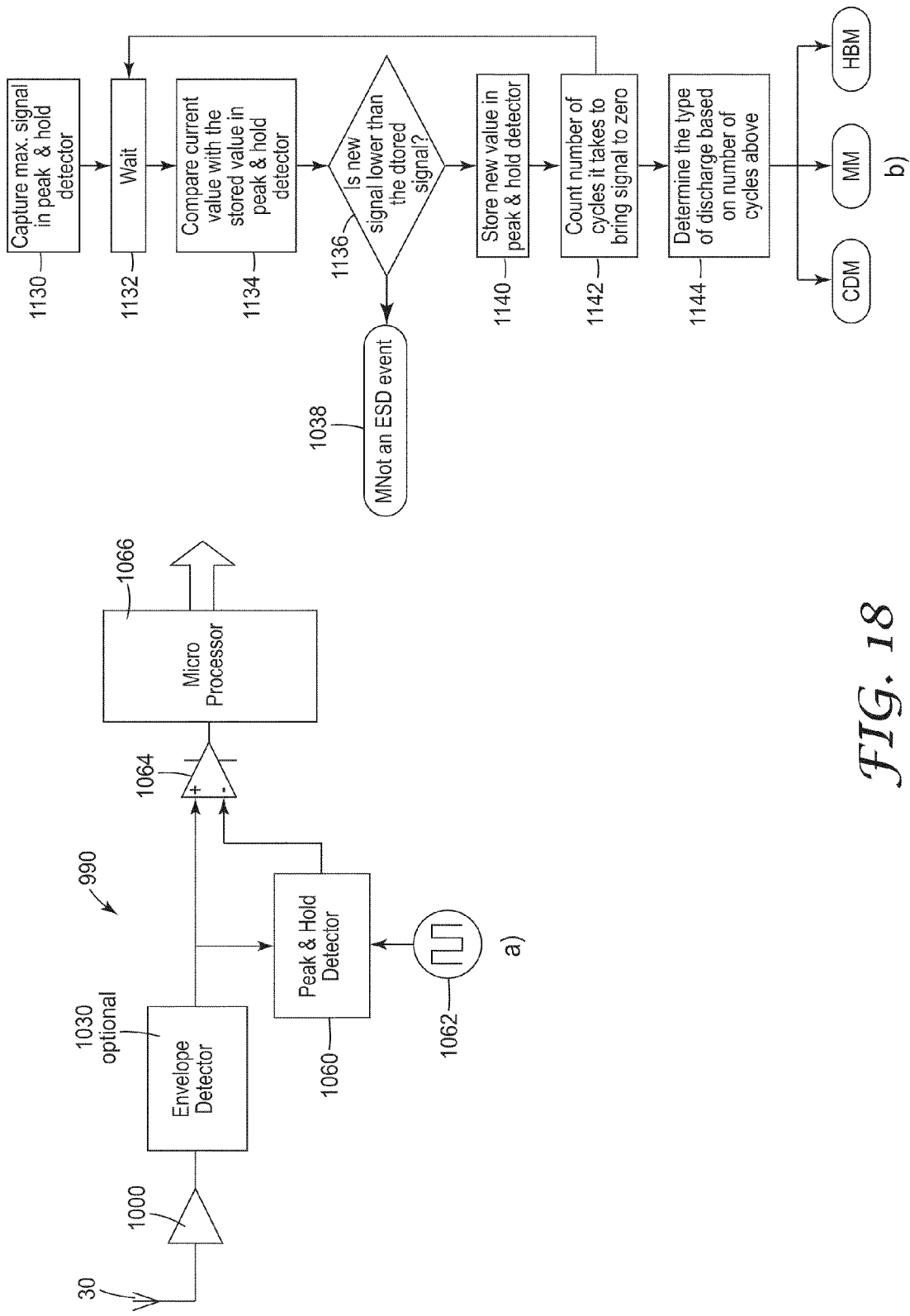
FIGS. 18a and 18b illustrate yet another embodiment of the circuit for determining the type of discharge and the method of operation, respectively.

Drawings,
In the drawings, Sheet 20, Fig. 18, No. 1136, delete "dtored" and insert --stored-- therefor.

Column 11,
Line 48, delete "COM" and insert --CDM-- therefor.

Signed and Sealed this
Ninth Day of August, 2011

David J. Kappos
*Director of the United States Patent and Trademark Office*